United States Patent
Ahn et al.

(10) Patent No.: US 7,670,646 B2
(45) Date of Patent: *Mar. 2, 2010

(54) METHODS FOR ATOMIC-LAYER DEPOSITION

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/620,324

(22) Filed: Jan. 5, 2007

(65) Prior Publication Data

US 2007/0101929 A1    May 10, 2007

Related U.S. Application Data

(63) Continuation of application No. 10/137,168, filed on May 2, 2002, now Pat. No. 7,160,577.

(51) Int. Cl.
   *C23C 16/00*   (2006.01)
(52) U.S. Cl. .............................. 427/255.32; 427/255.7; 427/255.28; 427/294
(58) Field of Classification Search .............. 427/248.1, 427/569; 118/728–732
See application file for complete search history.

(56) References Cited

U.S. PATENT DOCUMENTS

| | | | |
|---|---|---|---|
| 2,501,563 A | 3/1950 | Colbert et al. | |
| 3,357,961 A | 12/1967 | Makowski et al. | |
| 3,381,114 A | 4/1968 | Nakanuma | |
| 3,407,479 A | 10/1968 | Fordemwalt et al. | |
| 3,457,123 A | 7/1969 | Van Pul | |
| 3,471,754 A | 10/1969 | Hoshi et al. | |
| 3,689,357 A | 9/1972 | Jordan | |
| 4,051,354 A | 9/1977 | Choate | |
| 4,058,430 A | 11/1977 | Suntola et al. | |
| 4,209,357 A | 6/1980 | Gorin et al. | |
| 4,215,156 A | 7/1980 | Dalal et al. | |

(Continued)

FOREIGN PATENT DOCUMENTS

EP    0540993 A1    5/1993

(Continued)

OTHER PUBLICATIONS

"Improved Metallurgy for Wiring Very Large Scale Integrated Circuits", *International Technology Disclosures*, 4, Abstract,(1986),1 page.

(Continued)

*Primary Examiner*—David Turocy
(74) *Attorney, Agent, or Firm*—Schwegman, Lundberg & Woessner, P.A.

(57) ABSTRACT

Atomic-Layer deposition systems and methods provide a variety of electronic products. In an embodiment, a method uses an atomic-layer deposition system that includes an outer chamber, a substrate holder, and a gas-distribution fixture that engages or cooperates with the substrate holder to form an inner chamber within the outer chamber. The inner chamber has a smaller volume than the outer chamber, which leads to less time to fill and purge during cycle times for deposition of materials.

25 Claims, 3 Drawing Sheets

U.S. PATENT DOCUMENTS

| | | |
|---|---|---|
| 4,292,093 A | 9/1981 | Ownby et al. |
| 4,305,640 A | 12/1981 | Cullis et al. |
| 4,333,808 A | 6/1982 | Bhattacharyya et al. |
| 4,372,032 A | 2/1983 | Collins et al. |
| 4,394,673 A | 7/1983 | Thompson et al. |
| 4,399,424 A | 8/1983 | Rigby |
| 4,413,022 A | 11/1983 | Suntola et al. |
| 4,590,042 A | 5/1986 | Drage |
| 4,604,162 A | 8/1986 | Sobczak |
| 4,608,215 A | 8/1986 | Gonczy et al. |
| 4,640,871 A | 2/1987 | Hayashi et al. |
| 4,645,622 A | 2/1987 | Kock |
| 4,647,947 A | 3/1987 | Takeoka et al. |
| 4,663,831 A | 5/1987 | Birrittella et al. |
| 4,673,962 A | 6/1987 | Chatterjee et al. |
| 4,693,211 A | 9/1987 | Ogami et al. |
| 4,725,887 A | 2/1988 | Field |
| 4,749,888 A | 6/1988 | Sakai et al. |
| 4,757,360 A | 7/1988 | Faraone et al. |
| 4,761,768 A | 8/1988 | Turner et al. |
| 4,766,569 A | 8/1988 | Turner et al. |
| 4,767,641 A | 8/1988 | Kieser et al. |
| 4,864,375 A | 9/1989 | Teng et al. |
| 4,870,923 A | 10/1989 | Sugimoto |
| 4,894,801 A | 1/1990 | Saito et al. |
| 4,896,293 A | 1/1990 | McElroy |
| 4,902,533 A | 2/1990 | White et al. |
| 4,920,065 A | 4/1990 | Chin et al. |
| 4,920,071 A | 4/1990 | Thomas |
| 4,920,396 A | 4/1990 | Shinohara et al. |
| 4,926,224 A | 5/1990 | Redwine |
| 4,933,743 A | 6/1990 | Thomas et al. |
| 4,940,636 A | 7/1990 | Brock et al. |
| 4,947,221 A | 8/1990 | Stewart et al. |
| 4,948,937 A | 8/1990 | Blank et al. |
| 4,954,854 A | 9/1990 | Dhong et al. |
| 4,958,318 A | 9/1990 | Harari |
| 4,962,476 A | 10/1990 | Kawada |
| 4,962,879 A | 10/1990 | Goesele et al. |
| 4,975,014 A | 12/1990 | Rufin et al. |
| 4,987,089 A | 1/1991 | Roberts |
| 4,993,358 A | 2/1991 | Mahawili |
| 5,001,526 A | 3/1991 | Gotou |
| 5,006,192 A | 4/1991 | Deguchi |
| 5,006,909 A | 4/1991 | Kosa |
| 5,010,386 A | 4/1991 | Groover, III |
| 5,017,504 A | 5/1991 | Nishimura et al. |
| 5,019,728 A | 5/1991 | Sanwo et al. |
| 5,021,355 A | 6/1991 | Dhong et al. |
| 5,028,977 A | 7/1991 | Kenneth et al. |
| 5,032,545 A | 7/1991 | Doan et al. |
| 5,037,773 A | 8/1991 | Lee et al. |
| 5,049,516 A | 9/1991 | Arima |
| 5,053,351 A | 10/1991 | Fazan et al. |
| 5,055,319 A | 10/1991 | Bunshah et al. |
| 5,057,896 A | 10/1991 | Gotou |
| 5,072,269 A | 12/1991 | Hieda |
| 5,075,536 A | 12/1991 | Towe et al. |
| 5,080,928 A | 1/1992 | Klinedinst et al. |
| 5,089,084 A | 2/1992 | Chhabra et al. |
| 5,097,291 A | 3/1992 | Suzuki |
| 5,102,817 A | 4/1992 | Chatterjee et al. |
| 5,110,752 A | 5/1992 | Lu |
| 5,119,329 A | 6/1992 | Evans et al. |
| 5,122,848 A | 6/1992 | Lee et al. |
| 5,122,856 A | 6/1992 | Komiya |
| 5,135,879 A | 8/1992 | Richardson |
| 5,135,889 A | 8/1992 | Allen |
| 5,149,596 A | 9/1992 | Smith et al. |
| 5,156,987 A | 10/1992 | Sandhu et al. |
| 5,177,028 A | 1/1993 | Manning |
| 5,177,576 A | 1/1993 | Kimura et al. |
| 5,192,704 A | 3/1993 | McDavid et al. |
| 5,198,029 A | 3/1993 | Dutta et al. |
| 5,202,278 A | 4/1993 | Mathews et al. |
| 5,208,657 A | 5/1993 | Chatterjee et al. |
| 5,216,266 A | 6/1993 | Ozaki |
| 5,223,001 A | 6/1993 | Saeki |
| 5,223,081 A | 6/1993 | Doan |
| 5,223,808 A | 6/1993 | Lee et al. |
| 5,229,647 A | 7/1993 | Gnadinger |
| 5,234,535 A | 8/1993 | Beyer et al. |
| 5,241,211 A | 8/1993 | Tashiro |
| 5,254,499 A | 10/1993 | Sandhu et al. |
| 5,266,514 A | 11/1993 | Tuan et al. |
| 5,272,367 A | 12/1993 | Dennison et al. |
| 5,274,249 A | 12/1993 | Xi et al. |
| 5,302,461 A | 4/1994 | Anthony |
| 5,304,622 A | 4/1994 | Ikai et al. |
| 5,316,962 A | 5/1994 | Matsuo et al. |
| 5,320,880 A | 6/1994 | Sandhu et al. |
| 5,324,980 A | 6/1994 | Kusunoki |
| 5,327,380 A | 7/1994 | Kersh, III et al. |
| 5,352,998 A | 10/1994 | Tanino |
| 5,363,550 A | 11/1994 | Aitken et al. |
| 5,365,477 A | 11/1994 | Cooper, Jr. et al. |
| 5,376,575 A | 12/1994 | Kim et al. |
| 5,379,255 A | 1/1995 | Shah |
| 5,382,540 A | 1/1995 | Sharma et al. |
| 5,391,911 A | 2/1995 | Beyer et al. |
| 5,392,245 A | 2/1995 | Manning |
| 5,393,704 A | 2/1995 | Huang et al. |
| 5,396,093 A | 3/1995 | Lu |
| 5,410,169 A | 4/1995 | Yamamoto et al. |
| 5,414,287 A | 5/1995 | Hong |
| 5,414,288 A | 5/1995 | Fitch et al. |
| 5,416,041 A | 5/1995 | Schwalke |
| 5,421,953 A | 6/1995 | Nagakubo et al. |
| 5,422,499 A | 6/1995 | Manning |
| 5,426,603 A | 6/1995 | Nakamura et al. |
| 5,427,972 A | 6/1995 | Shimizu et al. |
| 5,429,966 A | 7/1995 | Wu et al. |
| 5,432,739 A | 7/1995 | Pein |
| 5,434,878 A | 7/1995 | Lawandy |
| 5,438,009 A | 8/1995 | Yang et al. |
| 5,439,524 A | 8/1995 | Cain et al. |
| 5,440,158 A | 8/1995 | Sung-Mu |
| 5,441,591 A | 8/1995 | Imthurn et al. |
| 5,444,013 A | 8/1995 | Akram et al. |
| 5,445,699 A | 8/1995 | Kamikawa et al. |
| 5,445,986 A | 8/1995 | Hirota |
| 5,449,433 A | 9/1995 | Donohoe |
| 5,450,026 A | 9/1995 | Morano |
| 5,455,445 A | 10/1995 | Kurtz et al. |
| 5,455,489 A | 10/1995 | Bhargava |
| 5,460,316 A | 10/1995 | Hefele |
| 5,460,988 A | 10/1995 | Hong |
| 5,466,625 A | 11/1995 | Hsieh et al. |
| 5,483,094 A | 1/1996 | Sharma et al. |
| 5,483,487 A | 1/1996 | Sung-Mu |
| 5,492,853 A | 2/1996 | Jeng et al. |
| 5,495,441 A | 2/1996 | Hong |
| 5,497,017 A | 3/1996 | Gonzales |
| 5,504,357 A | 4/1996 | Kim et al. |
| 5,504,376 A | 4/1996 | Sugahara et al. |
| 5,508,219 A | 4/1996 | Bronner et al. |
| 5,508,542 A | 4/1996 | Geiss et al. |
| 5,510,758 A | 4/1996 | Fujita et al. |
| 5,516,588 A | 5/1996 | van den Berg et al. |
| 5,519,236 A | 5/1996 | Ozaki |
| 5,521,536 A | 5/1996 | Yamashita et al. |
| 5,522,932 A | 6/1996 | Wong et al. |
| 5,523,261 A | 6/1996 | Sandhu |
| 5,528,062 A | 6/1996 | Hsieh et al. |

| | | | | | |
|---|---|---|---|---|---|
| 5,562,952 A | 10/1996 | Nakahigashi et al. | 5,952,039 A | 9/1999 | Hong |
| 5,563,083 A | 10/1996 | Pein | 5,958,140 A | 9/1999 | Arami et al. |
| 5,572,052 A | 11/1996 | Kashihara et al. | 5,962,132 A | 10/1999 | Chang et al. |
| 5,574,299 A | 11/1996 | Kim | 5,963,833 A | 10/1999 | Thakur |
| 5,585,020 A | 12/1996 | Becker et al. | 5,972,847 A | 10/1999 | Feenstra et al. |
| 5,587,609 A | 12/1996 | Murakami et al. | 5,973,352 A | 10/1999 | Noble |
| 5,593,912 A | 1/1997 | Rajeevakumar | 5,973,356 A | 10/1999 | Noble et al. |
| 5,595,606 A | 1/1997 | Fujikawa et al. | 5,981,350 A | 11/1999 | Geusic et al. |
| 5,599,396 A | 2/1997 | Sandhu | 5,989,511 A | 11/1999 | Gruen et al. |
| 5,614,026 A | 3/1997 | Williams | 5,990,605 A | 11/1999 | Yoshikawa et al. |
| 5,616,934 A | 4/1997 | Dennison et al. | 5,991,225 A | 11/1999 | Forbes et al. |
| 5,619,159 A | 4/1997 | Sasaki et al. | 5,994,240 A | 11/1999 | Thakur |
| 5,621,681 A | 4/1997 | Moon | 5,998,528 A | 12/1999 | Tsipursky et al. |
| 5,625,233 A | 4/1997 | Cabral, Jr. et al. | 6,010,969 A | 1/2000 | Vaartstra |
| 5,636,170 A | 6/1997 | Seyyedy | 6,013,548 A | 1/2000 | Burns, Jr. et al. |
| 5,640,342 A | 6/1997 | Gonzalez | 6,013,553 A | 1/2000 | Wallace et al. |
| 5,644,540 A | 7/1997 | Manning | 6,017,820 A | 1/2000 | Ting et al. |
| 5,646,900 A | 7/1997 | Tsukude et al. | 6,019,848 A | 2/2000 | Frankel et al. |
| 5,652,061 A | 7/1997 | Jeng et al. | 6,020,024 A | 2/2000 | Maiti et al. |
| 5,656,548 A | 8/1997 | Zavracky et al. | 6,020,243 A | 2/2000 | Wallace et al. |
| 5,662,834 A | 9/1997 | Schulz et al. | 6,022,787 A | 2/2000 | Ma |
| 5,674,563 A | 10/1997 | Tarui et al. | 6,023,124 A | 2/2000 | Chuman et al. |
| 5,674,574 A | 10/1997 | Atwell et al. | 6,023,125 A | 2/2000 | Yoshikawa et al. |
| 5,691,230 A | 11/1997 | Forbes | 6,025,034 A | 2/2000 | Strutt et al. |
| 5,696,008 A | 12/1997 | Tamaki et al. | 6,025,225 A | 2/2000 | Forbes et al. |
| 5,698,022 A | 12/1997 | Glassman et al. | 6,025,627 A | 2/2000 | Forbes et al. |
| 5,705,415 A | 1/1998 | Orlowski et al. | 6,027,960 A | 2/2000 | Kusumoto et al. |
| 5,710,057 A | 1/1998 | Kenney | 6,027,961 A | 2/2000 | Maiti et al. |
| 5,714,336 A | 2/1998 | Simons et al. | 6,034,015 A | 3/2000 | Lin et al. |
| 5,714,766 A | 2/1998 | Chen et al. | 6,034,389 A | 3/2000 | Burns et al. |
| 5,729,047 A | 3/1998 | Ma | 6,040,218 A | 3/2000 | Lam |
| 5,735,960 A | 4/1998 | Sandhu et al. | 6,040,243 A | 3/2000 | Li et al. |
| 5,739,524 A | 4/1998 | Fally | 6,057,271 A | 5/2000 | Kenjiro et al. |
| 5,744,374 A | 4/1998 | Moon | 6,059,885 A | 5/2000 | Ohashi et al. |
| 5,745,334 A | 4/1998 | Hoffarth et al. | 6,060,743 A | 5/2000 | Sugiyama et al. |
| 5,751,021 A | 5/1998 | Teraguchi | 6,060,755 A | 5/2000 | Ma et al. |
| 5,756,404 A | 5/1998 | Friedenreich et al. | 6,063,705 A | 5/2000 | Vaartstra |
| 5,757,044 A | 5/1998 | Kubota | 6,066,869 A | 5/2000 | Noble et al. |
| 5,765,214 A | 6/1998 | Sywyk | 6,072,209 A | 6/2000 | Noble et al. |
| 5,770,022 A | 6/1998 | Chang et al. | 6,075,383 A | 6/2000 | Terletski |
| 5,772,153 A | 6/1998 | Abaunza et al. | 6,075,691 A | 6/2000 | Duenas et al. |
| 5,772,760 A | 6/1998 | Gruen et al. | 6,077,745 A | 6/2000 | Burns, Jr. et al. |
| 5,789,030 A | 8/1998 | Rolfson | RE36,760 E | 7/2000 | Bloomquist et al. |
| 5,792,269 A | 8/1998 | Deacon et al. | 6,083,793 A | 7/2000 | Wu |
| 5,795,808 A | 8/1998 | Park | 6,090,636 A | 7/2000 | Geusic et al. |
| 5,801,105 A | 9/1998 | Yano et al. | 6,093,623 A | 7/2000 | Forbes |
| 5,810,923 A | 9/1998 | Yano et al. | 6,093,944 A | 7/2000 | VanDover |
| 5,811,984 A | 9/1998 | Long et al. | 6,103,419 A | 8/2000 | Saidi et al. |
| 5,822,256 A | 10/1998 | Bauer et al. | 6,104,061 A | 8/2000 | Forbes et al. |
| 5,827,571 A | 10/1998 | Lee et al. | 6,110,529 A | 8/2000 | Gardiner et al. |
| 5,828,080 A | 10/1998 | Yano et al. | 6,111,285 A | 8/2000 | Al-Shareef et al. |
| 5,840,897 A | 11/1998 | Kirlin et al. | 6,114,252 A | 9/2000 | Donohoe et al. |
| 5,851,880 A | 12/1998 | Ikegami | 6,114,725 A | 9/2000 | Furukawa et al. |
| 5,869,369 A | 2/1999 | Hong | 6,115,401 A | 9/2000 | Scobey et al. |
| 5,874,134 A | 2/1999 | Rao et al. | 6,120,531 A | 9/2000 | Zhou et al. |
| 5,874,760 A | 2/1999 | Burns, Jr. et al. | 6,124,729 A | 9/2000 | Noble et al. |
| 5,879,459 A | 3/1999 | Gadgil et al. | 6,125,062 A | 9/2000 | Ahn et al. |
| 5,880,601 A | 3/1999 | Kanazawa et al. | 6,127,287 A | 10/2000 | Hurley et al. |
| 5,882,779 A | 3/1999 | Lawandy | 6,129,928 A | 10/2000 | Sarangapani et al. |
| 5,885,864 A | 3/1999 | Ma | 6,130,503 A | 10/2000 | Negishi et al. |
| 5,888,868 A | 3/1999 | Yamazaki et al. | 6,133,621 A | 10/2000 | Gaibotti et al. |
| 5,891,773 A | 4/1999 | Saitoh | 6,134,175 A | 10/2000 | Forbes et al. |
| 5,892,249 A | 4/1999 | Courtright et al. | 6,137,025 A | 10/2000 | Ebbinghaus et al. |
| 5,907,170 A | 5/1999 | Forbes et al. | 6,140,181 A | 10/2000 | Forbes et al. |
| 5,909,618 A | 6/1999 | Forbes et al. | 6,141,238 A | 10/2000 | Forbes et al. |
| 5,910,684 A | 6/1999 | Sandhu et al. | 6,141,260 A | 10/2000 | Ahn et al. |
| 5,910,880 A | 6/1999 | DeBoer et al. | 6,143,582 A | 11/2000 | Vu et al. |
| 5,912,797 A | 6/1999 | Schneemeyer et al. | 6,143,616 A | 11/2000 | Geusic et al. |
| 5,916,365 A | 6/1999 | Sherman | 6,143,636 A | 11/2000 | Forbes et al. |
| 5,923,056 A | 7/1999 | Lee et al. | 6,144,155 A | 11/2000 | Yoshikawa et al. |
| 5,936,274 A | 8/1999 | Forbes et al. | 6,146,959 A | 11/2000 | DeBoer et al. |
| 5,939,146 A | 8/1999 | Lavernia | 6,146,976 A | 11/2000 | Stecher et al. |
| 5,950,925 A | 9/1999 | Fukunaga et al. | 6,147,443 A | 11/2000 | Yoshikawa et al. |

| Patent | Kind | Date | Inventors |
|---|---|---|---|
| 6,150,188 | A | 11/2000 | Geusic et al. |
| 6,150,687 | A | 11/2000 | Noble et al. |
| 6,150,724 | A | 11/2000 | Wenzel et al. |
| 6,153,468 | A | 11/2000 | Forbes et al. |
| 6,154,280 | A | 11/2000 | Borden |
| H1924 | H | 12/2000 | Zabinski et al. |
| 6,161,500 | A | 12/2000 | Kopacz et al. |
| 6,162,712 | A | 12/2000 | Baum et al. |
| 6,165,837 | A | 12/2000 | Kawakubo et al. |
| 6,166,487 | A | 12/2000 | Negishi et al. |
| 6,171,900 | B1 | 1/2001 | Sun |
| 6,174,784 | B1 | 1/2001 | Forbes |
| 6,174,809 | B1 | 1/2001 | Kang et al. |
| 6,184,146 | B1 | 2/2001 | Donohoe et al. |
| 6,184,549 | B1 | 2/2001 | Furukawa et al. |
| 6,184,550 | B1 | 2/2001 | Van Buskirk et al. |
| 6,184,612 | B1 | 2/2001 | Negishi et al. |
| 6,187,484 | B1 | 2/2001 | Glass et al. |
| 6,191,443 | B1 | 2/2001 | Al-Shareef et al. |
| 6,191,448 | B1 | 2/2001 | Forbes et al. |
| 6,191,470 | B1 | 2/2001 | Forbes et al. |
| 6,194,237 | B1 | 2/2001 | Kim et al. |
| 6,194,262 | B1 | 2/2001 | Noble |
| 6,198,168 | B1 | 3/2001 | Geusic et al. |
| 6,200,893 | B1 | 3/2001 | Sneh |
| 6,203,613 | B1 | 3/2001 | Gates et al. |
| 6,203,726 | B1 | 3/2001 | Danielson et al. |
| 6,206,972 | B1 | 3/2001 | Dunham |
| 6,207,522 | B1 | 3/2001 | Hunt et al. |
| 6,207,589 | B1 | 3/2001 | Ma et al. |
| 6,208,164 | B1 | 3/2001 | Noble et al. |
| 6,208,881 | B1 | 3/2001 | Champeau |
| 6,210,999 | B1 | 4/2001 | Gardner et al. |
| 6,211,015 | B1 | 4/2001 | Noble |
| 6,211,035 | B1 | 4/2001 | Moise et al. |
| 6,211,039 | B1 | 4/2001 | Noble |
| 6,217,645 | B1 | 4/2001 | Vaartstra |
| 6,218,293 | B1 | 4/2001 | Kraus et al. |
| 6,219,299 | B1 | 4/2001 | Forbes et al. |
| 6,222,788 | B1 | 4/2001 | Forbes et al. |
| 6,224,690 | B1 | 5/2001 | Andricacos et al. |
| 6,225,168 | B1 | 5/2001 | Gardner et al. |
| 6,225,237 | B1 | 5/2001 | Vaartstra |
| 6,226,599 | B1 | 5/2001 | Namiki |
| 6,230,651 | B1 | 5/2001 | Ni et al. |
| 6,232,643 | B1 | 5/2001 | Forbes et al. |
| 6,232,847 | B1 | 5/2001 | Marcy, 5th et al. |
| 6,238,976 | B1 | 5/2001 | Noble et al. |
| 6,246,606 | B1 | 6/2001 | Forbes et al. |
| 6,249,460 | B1 | 6/2001 | Forbes et al. |
| 6,252,267 | B1 | 6/2001 | Noble, Jr. |
| 6,255,852 | B1 | 7/2001 | Forbes et al. |
| 6,258,637 | B1 | 7/2001 | Wilk et al. |
| 6,259,198 | B1 | 7/2001 | Yanagisawa et al. |
| 6,270,835 | B1 | 8/2001 | Hunt et al. |
| 6,273,951 | B1 | 8/2001 | Vaartstra |
| 6,274,479 | B1 | 8/2001 | Srinivasan |
| 6,274,937 | B1 | 8/2001 | Ahn et al. |
| 6,277,448 | B2 | 8/2001 | Strutt et al. |
| 6,278,230 | B1 | 8/2001 | Yoshizawa et al. |
| 6,281,042 | B1 | 8/2001 | Ahn et al. |
| 6,281,054 | B1 | 8/2001 | Yeo |
| 6,281,144 | B1 | 8/2001 | Cleary et al. |
| 6,282,080 | B1 | 8/2001 | DeBoer et al. |
| 6,285,123 | B1 | 9/2001 | Yamada et al. |
| 6,289,842 | B1 | 9/2001 | Tompa |
| 6,290,491 | B1 * | 9/2001 | Shahvandi et al. ............. 432/5 |
| 6,291,314 | B1 | 9/2001 | Henley et al. |
| 6,291,341 | B1 | 9/2001 | Sharan et al. |
| 6,291,364 | B1 | 9/2001 | Gealy et al. |
| 6,291,866 | B1 | 9/2001 | Wallace et al. |
| 6,294,813 | B1 | 9/2001 | Forbes et al. |
| 6,296,943 | B1 | 10/2001 | Watanabe et al. |
| 6,297,095 | B1 | 10/2001 | Muralidhar et al. |
| 6,297,103 | B1 | 10/2001 | Ahn et al. |
| 6,297,516 | B1 | 10/2001 | Forrest et al. |
| 6,297,527 | B1 | 10/2001 | Agarwal et al. |
| 6,297,539 | B1 | 10/2001 | Ma et al. |
| 6,300,203 | B1 | 10/2001 | Buynoski et al. |
| 6,300,255 | B1 | 10/2001 | Venkataranan et al. |
| 6,302,964 | B1 | 10/2001 | Umotoy et al. |
| 6,303,481 | B2 | 10/2001 | Park |
| 6,303,500 | B1 | 10/2001 | Jiang et al. |
| 6,313,015 | B1 | 11/2001 | Lee et al. |
| 6,313,035 | B1 | 11/2001 | Sandhu et al. |
| 6,313,518 | B1 | 11/2001 | Ahn et al. |
| 6,313,531 | B1 | 11/2001 | Geusic et al. |
| 6,316,800 | B1 | 11/2001 | Al-Shareef et al. |
| 6,316,873 | B1 | 11/2001 | Ito et al. |
| 6,317,175 | B1 | 11/2001 | Salerno et al. |
| 6,317,357 | B1 | 11/2001 | Forbes |
| 6,320,091 | B1 | 11/2001 | Ebbinghaus et al. |
| 6,331,282 | B1 | 12/2001 | Manthiram et al. |
| 6,331,465 | B1 | 12/2001 | Forbes et al. |
| 6,337,805 | B1 | 1/2002 | Forbes et al. |
| 6,342,445 | B1 | 1/2002 | Marsh |
| 6,346,477 | B1 | 2/2002 | Kaloyeros et al. |
| 6,347,749 | B1 | 2/2002 | Moore et al. |
| 6,348,386 | B1 | 2/2002 | Gilmer |
| 6,348,709 | B1 | 2/2002 | Graettinger et al. |
| 6,350,649 | B1 | 2/2002 | Jeong et al. |
| 6,350,704 | B1 | 2/2002 | Ahn et al. |
| 6,351,411 | B2 | 2/2002 | Forbes et al. |
| 6,352,591 | B1 | 3/2002 | Yieh et al. |
| 6,355,561 | B1 | 3/2002 | Sandhu et al. |
| 6,365,470 | B1 | 4/2002 | Maeda |
| 6,365,519 | B2 | 4/2002 | Kraus et al. |
| 6,368,398 | B2 | 4/2002 | Vaartstra |
| 6,368,518 | B1 | 4/2002 | Vaartstra |
| 6,368,941 | B1 | 4/2002 | Chen et al. |
| 6,373,740 | B1 | 4/2002 | Forbes et al. |
| 6,377,070 | B1 | 4/2002 | Forbes |
| 6,380,579 | B1 | 4/2002 | Nam et al. |
| 6,380,765 | B1 | 4/2002 | Forbes et al. |
| 6,381,124 | B1 | 4/2002 | Whitcher et al. |
| 6,381,168 | B2 | 4/2002 | Forbes |
| 6,387,712 | B1 | 5/2002 | Yano et al. |
| 6,388,376 | B1 | 5/2002 | Negishi et al. |
| 6,391,769 | B1 | 5/2002 | Lee et al. |
| 6,392,257 | B1 | 5/2002 | Ramdani et al. |
| 6,395,650 | B1 | 5/2002 | Callegari et al. |
| 6,399,979 | B1 | 6/2002 | Noble et al. |
| 6,400,070 | B1 | 6/2002 | Yamada et al. |
| 6,400,552 | B2 | 6/2002 | Al-Shareef et al. |
| 6,403,494 | B1 | 6/2002 | Chu et al. |
| 6,404,027 | B1 | 6/2002 | Hong et al. |
| 6,404,124 | B1 | 6/2002 | Sakemura et al. |
| 6,407,435 | B1 | 6/2002 | Ma et al. |
| 6,414,476 | B2 | 7/2002 | Yagi |
| 6,414,543 | B1 | 7/2002 | Beigel et al. |
| 6,417,537 | B1 | 7/2002 | Yang et al. |
| 6,418,050 | B2 | 7/2002 | Forbes |
| 6,420,230 | B1 | 7/2002 | Derderian et al. |
| 6,420,279 | B1 | 7/2002 | Ono et al. |
| 6,420,778 | B1 | 7/2002 | Sinyansky |
| 6,423,613 | B1 | 7/2002 | Geusic |
| 6,423,649 | B2 | 7/2002 | Gealy et al. |
| 6,424,001 | B1 | 7/2002 | Forbes et al. |
| 6,429,065 | B2 | 8/2002 | Forbes |
| 6,432,779 | B1 | 8/2002 | Hobbs et al. |
| 6,433,408 | B1 | 8/2002 | Anjo et al. |
| 6,433,993 | B1 | 8/2002 | Hunt et al. |
| 6,434,041 | B2 | 8/2002 | Forbes |
| 6,436,203 | B1 | 8/2002 | Kaizuka et al. |
| 6,437,389 | B1 | 8/2002 | Forbes et al. |
| 6,441,417 | B1 | 8/2002 | Zhang et al. |

| | | |
|---|---|---|
| 6,444,039 B1 | 9/2002 | Nguyen |
| 6,444,042 B1 | 9/2002 | Yang et al. |
| 6,444,592 B1 | 9/2002 | Ballantine et al. |
| 6,444,895 B1 | 9/2002 | Nikawa |
| 6,445,023 B1 | 9/2002 | Vaartstra et al. |
| 6,447,764 B1 | 9/2002 | Bayer et al. |
| 6,447,848 B1 | 9/2002 | Chow et al. |
| 6,448,192 B1 | 9/2002 | Kaushik |
| 6,448,601 B1 | 9/2002 | Forbes et al. |
| 6,451,641 B1 | 9/2002 | Halliyal et al. |
| 6,451,662 B1 | 9/2002 | Chudzik et al. |
| 6,451,695 B2 | 9/2002 | Sneh |
| 6,452,229 B1 | 9/2002 | Krivokapic |
| 6,454,912 B1 | 9/2002 | Ahn et al. |
| 6,455,717 B1 | 9/2002 | Vaartstra |
| 6,456,535 B2 | 9/2002 | Forbes et al. |
| 6,458,431 B2 | 10/2002 | Hill et al. |
| 6,458,645 B2 | 10/2002 | DeBoer et al. |
| 6,458,701 B1 | 10/2002 | Chae et al. |
| 6,461,436 B1 | 10/2002 | Campbell et al. |
| 6,461,914 B1 | 10/2002 | Roberts et al. |
| 6,461,970 B1 | 10/2002 | Yin |
| 6,465,298 B2 | 10/2002 | Forbes et al. |
| 6,465,334 B1 | 10/2002 | Buynoski et al. |
| 6,465,853 B1 | 10/2002 | Hobbs et al. |
| 6,472,321 B2 | 10/2002 | Srinivasan et al. |
| 6,472,632 B1 | 10/2002 | Peterson et al. |
| 6,472,702 B1 | 10/2002 | Shen |
| 6,472,803 B1 | 10/2002 | Yoshizawa et al. |
| 6,476,434 B1 | 11/2002 | Noble et al. |
| 6,482,740 B2 | 11/2002 | Soininen et al. |
| 6,486,027 B1 | 11/2002 | Noble et al. |
| 6,486,703 B2 | 11/2002 | Noble et al. |
| 6,489,648 B2 | 12/2002 | Iwasaki et al. |
| 6,492,233 B2 | 12/2002 | Forbes et al. |
| 6,492,241 B1 | 12/2002 | Rhodes et al. |
| 6,492,288 B2 | 12/2002 | Shindo |
| 6,495,436 B2 | 12/2002 | Ahn et al. |
| 6,496,034 B2 | 12/2002 | Forbes et al. |
| 6,498,063 B1 | 12/2002 | Ping |
| 6,498,065 B1 | 12/2002 | Forbes et al. |
| 6,504,214 B1 | 1/2003 | Yu et al. |
| 6,506,666 B2 | 1/2003 | Marsh |
| 6,509,280 B2 | 1/2003 | Choi |
| 6,514,348 B2 | 2/2003 | Miyamoto |
| 6,514,820 B2 | 2/2003 | Ahn et al. |
| 6,514,828 B2 | 2/2003 | Ahn et al. |
| 6,515,510 B2 | 2/2003 | Noble et al. |
| 6,518,121 B2 | 2/2003 | Al-Shareef et al. |
| 6,518,610 B2 | 2/2003 | Yang et al. |
| 6,518,615 B1 | 2/2003 | Geusic et al. |
| 6,518,634 B1 | 2/2003 | Kaushik et al. |
| 6,521,911 B2 | 2/2003 | Parsons et al. |
| 6,524,867 B2 | 2/2003 | Yang et al. |
| 6,524,901 B1 | 2/2003 | Trivedi |
| 6,526,191 B1 | 2/2003 | Geusic et al. |
| 6,527,866 B1 | 3/2003 | Matijasevic et al. |
| 6,531,354 B2 | 3/2003 | Maria et al. |
| 6,531,727 B2 | 3/2003 | Forbes et al. |
| 6,533,867 B2 | 3/2003 | Doppelhammer |
| 6,534,357 B1 | 3/2003 | Basceri |
| 6,534,420 B2 | 3/2003 | Ahn et al. |
| 6,537,613 B1 | 3/2003 | Senzaki et al. |
| 6,538,330 B1 | 3/2003 | Forbes |
| 6,540,214 B2 | 4/2003 | Barber |
| 6,541,079 B1 | 4/2003 | Bojarczuk, Jr. et al. |
| 6,541,280 B2 | 4/2003 | Kaushik et al. |
| 6,541,353 B1 | 4/2003 | Sandhu et al. |
| 6,544,846 B2 | 4/2003 | Ahn et al. |
| 6,544,875 B1 | 4/2003 | Wilk |
| 6,545,314 B2 | 4/2003 | Forbes et al. |
| 6,545,338 B1 | 4/2003 | Bothra et al. |
| 6,551,893 B1 | 4/2003 | Zheng et al. |
| 6,551,929 B1 | 4/2003 | Kori et al. |
| 6,552,383 B2 | 4/2003 | Ahn et al. |
| 6,555,858 B1 | 4/2003 | Jones et al. |
| 6,559,014 B1 | 5/2003 | Jeon |
| 6,559,472 B2 | 5/2003 | Sandhu et al. |
| 6,559,491 B2 | 5/2003 | Forbes et al. |
| 6,566,147 B2 | 5/2003 | Basceri et al. |
| 6,566,682 B2 | 5/2003 | Forbes |
| 6,569,757 B1 | 5/2003 | Weling et al. |
| 6,570,248 B1 | 5/2003 | Ahn et al. |
| 6,572,836 B1 | 6/2003 | Schulz et al. |
| 6,573,199 B2 | 6/2003 | Sandhu et al. |
| 6,580,124 B1 | 6/2003 | Cleeves et al. |
| 6,586,349 B1 | 7/2003 | Jeon et al. |
| 6,586,785 B2 | 7/2003 | Flagan et al. |
| 6,586,792 B2 | 7/2003 | Ahn et al. |
| 6,586,797 B2 | 7/2003 | Forbes et al. |
| 6,587,408 B1 | 7/2003 | Jacobson et al. |
| 6,590,252 B2 | 7/2003 | Kutsunai et al. |
| 6,592,661 B1 | 7/2003 | Thakur et al. |
| 6,592,839 B2 | 7/2003 | Gruen et al. |
| 6,592,942 B1 | 7/2003 | Van Wijck |
| 6,593,610 B2 | 7/2003 | Gonzalez |
| 6,596,583 B2 | 7/2003 | Agarwal et al. |
| 6,596,636 B2 | 7/2003 | Sandhu et al. |
| 6,597,037 B1 | 7/2003 | Forbes et al. |
| 6,600,339 B2 | 7/2003 | Forbes et al. |
| 6,602,053 B2 | 8/2003 | Subramanian et al. |
| 6,602,338 B2 | 8/2003 | Chen et al. |
| 6,608,378 B2 | 8/2003 | Ahn et al. |
| 6,613,656 B2 | 9/2003 | Li |
| 6,613,695 B2 | 9/2003 | Pomarede et al. |
| 6,613,702 B2 | 9/2003 | Sandhu et al. |
| 6,617,634 B2 | 9/2003 | Marsh et al. |
| 6,620,670 B2 | 9/2003 | Song et al. |
| 6,620,752 B2 | 9/2003 | Messing et al. |
| 6,627,260 B2 | 9/2003 | Derderian et al. |
| 6,627,503 B2 | 9/2003 | Ma et al. |
| 6,627,508 B1 | 9/2003 | DeBoer et al. |
| 6,630,713 B2 | 10/2003 | Geusic |
| 6,632,279 B1 | 10/2003 | Ritala et al. |
| 6,638,575 B1 | 10/2003 | Chen et al. |
| 6,638,810 B2 | 10/2003 | Bakli et al. |
| 6,638,859 B2 | 10/2003 | Sneh et al. |
| 6,639,267 B2 | 10/2003 | Eldridge |
| 6,639,268 B2 | 10/2003 | Forbes et al. |
| 6,641,887 B2 | 11/2003 | Lida et al. |
| 6,642,567 B1 | 11/2003 | Marsh |
| 6,642,573 B1 | 11/2003 | Halliyal et al. |
| 6,645,569 B2 | 11/2003 | Cramer et al. |
| 6,645,882 B1 | 11/2003 | Halliyal et al. |
| 6,652,924 B2 | 11/2003 | Sherman |
| 6,653,209 B1 | 11/2003 | Yamagata |
| 6,653,591 B1 | 11/2003 | Peterson et al. |
| 6,656,371 B2 | 12/2003 | Drewes |
| 6,656,792 B2 | 12/2003 | Choi et al. |
| 6,656,835 B2 | 12/2003 | Marsh et al. |
| 6,660,660 B2 | 12/2003 | Haukka et al. |
| 6,661,058 B2 | 12/2003 | Ahn et al. |
| 6,664,806 B2 | 12/2003 | Forbes et al. |
| 6,669,996 B2 | 12/2003 | Ueno et al. |
| 6,670,284 B2 | 12/2003 | Yin |
| 6,673,701 B1 | 1/2004 | Marsh et al. |
| 6,674,138 B1 | 1/2004 | Halliyal et al. |
| 6,677,250 B2 | 1/2004 | Campbell et al. |
| 6,677,640 B1 | 1/2004 | Sandhu et al. |
| 6,682,602 B2 | 1/2004 | Vaartstra |
| 6,682,969 B1 | 1/2004 | Basceri et al. |
| 6,683,005 B2 | 1/2004 | Sandhu et al. |
| 6,683,011 B2 | 1/2004 | Smith et al. |
| 6,686,212 B1 | 2/2004 | Conley, Jr. et al. |
| 6,689,192 B1 | 2/2004 | Phillips et al. |
| 6,689,660 B1 | 2/2004 | Noble et al. |

| Patent | Date | Inventor |
|---|---|---|
| 6,692,898 B2 | 2/2004 | Ning |
| 6,696,332 B2 | 2/2004 | Visokay et al. |
| 6,696,724 B2 | 2/2004 | Verhaar |
| 6,699,745 B1 | 3/2004 | Banerjee et al. |
| 6,699,747 B2 | 3/2004 | Ruff et al. |
| 6,700,132 B2 | 3/2004 | Chuman et al. |
| 6,709,978 B2 | 3/2004 | Geusic et al. |
| 6,709,989 B2 | 3/2004 | Ramdani et al. |
| 6,710,538 B1 | 3/2004 | Ahn et al. |
| 6,713,329 B1 | 3/2004 | Wagner et al. |
| 6,713,846 B1 | 3/2004 | Senzaki |
| 6,720,216 B2 | 4/2004 | Forbes |
| 6,720,221 B1 | 4/2004 | Ahn et al. |
| 6,723,577 B1 | 4/2004 | Geusic et al. |
| 6,723,606 B2 | 4/2004 | Flagan et al. |
| 6,727,105 B1 | 4/2004 | Brug et al. |
| 6,728,092 B2 | 4/2004 | Hunt et al. |
| 6,730,163 B2 | 5/2004 | Vaartstra |
| 6,730,164 B2 | 5/2004 | Vaartstra et al. |
| 6,730,367 B2 | 5/2004 | Sandhu |
| 6,730,575 B2 | 5/2004 | Eldridge |
| 6,731,531 B1 | 5/2004 | Forbes et al. |
| 6,734,480 B2 | 5/2004 | Chung et al. |
| 6,734,510 B2 | 5/2004 | Forbes et al. |
| 6,737,740 B2 | 5/2004 | Forbes et al. |
| 6,737,887 B2 | 5/2004 | Forbes et al. |
| 6,740,605 B1 | 5/2004 | Shiraiwa et al. |
| 6,744,063 B2 | 6/2004 | Yoshikawa et al. |
| 6,744,093 B2 | 6/2004 | Agarwal et al. |
| 6,746,893 B1 | 6/2004 | Forbes et al. |
| 6,746,930 B2 | 6/2004 | Yang et al. |
| 6,746,934 B2 | 6/2004 | Sandhu et al. |
| 6,750,066 B1 | 6/2004 | Cheung et al. |
| 6,754,108 B2 | 6/2004 | Forbes |
| 6,755,886 B2 | 6/2004 | Phillips et al. |
| 6,756,237 B2 | 6/2004 | Xiao et al. |
| 6,756,298 B2 | 6/2004 | Ahn et al. |
| 6,759,081 B2 | 7/2004 | Huganen et al. |
| 6,762,114 B1 | 7/2004 | Chambers |
| 6,764,901 B2 | 7/2004 | Noble et al. |
| 6,767,419 B1 | 7/2004 | Branagan |
| 6,767,582 B1 | 7/2004 | Elers |
| 6,767,795 B2 | 7/2004 | Ahn et al. |
| 6,768,175 B1 | 7/2004 | Morishita et al. |
| 6,770,536 B2 | 8/2004 | Wilk et al. |
| 6,770,923 B2 | 8/2004 | Nguyen et al. |
| 6,773,981 B1 | 8/2004 | Al-Shareef et al. |
| 6,774,050 B2 | 8/2004 | Ahn et al. |
| 6,777,353 B2 | 8/2004 | Putkonen |
| 6,777,715 B1 | 8/2004 | Geusic et al. |
| 6,777,739 B2 | 8/2004 | Agarwal et al. |
| 6,778,441 B2 | 8/2004 | Forbes et al. |
| 6,780,704 B1 | 8/2004 | Raaijmakers et al. |
| 6,784,049 B2 | 8/2004 | Vaartstra |
| 6,787,122 B2 | 9/2004 | Zhou |
| 6,787,370 B2 | 9/2004 | Forbes |
| 6,787,413 B2 | 9/2004 | Ahn et al. |
| 6,787,463 B2 | 9/2004 | Mardian et al. |
| 6,787,888 B2 | 9/2004 | Forbes et al. |
| 6,787,906 B1 | 9/2004 | Yang et al. |
| 6,787,992 B2 | 9/2004 | Chuman et al. |
| 6,790,791 B2 | 9/2004 | Ahn et al. |
| 6,794,255 B1 | 9/2004 | Forbes et al. |
| 6,794,284 B2 | 9/2004 | Vaartstra |
| 6,794,315 B1 | 9/2004 | Klemperer et al. |
| 6,794,709 B2 | 9/2004 | Ahn et al. |
| 6,794,735 B2 | 9/2004 | Forbes et al. |
| 6,800,567 B2 | 10/2004 | Cho |
| 6,803,311 B2 | 10/2004 | Choi |
| 6,803,326 B2 | 10/2004 | Ahn et al. |
| 6,804,136 B2 | 10/2004 | Forbes |
| 6,806,187 B2 | 10/2004 | Graettinger et al. |
| 6,806,211 B2 | 10/2004 | Shinriki et al. |
| 6,808,978 B2 | 10/2004 | Kim |
| 6,812,100 B2 | 11/2004 | Ahn et al. |
| 6,812,110 B1 | 11/2004 | Basceri et al. |
| 6,812,137 B2 | 11/2004 | Forbes et al. |
| 6,812,157 B1 | 11/2004 | Gadgil |
| 6,815,804 B2 | 11/2004 | Forbes |
| 6,818,067 B2 * | 11/2004 | Doering et al. ............ 118/715 |
| 6,821,862 B2 | 11/2004 | Cho |
| 6,821,873 B2 | 11/2004 | Visokay et al. |
| 6,828,632 B2 | 12/2004 | Bhattacharyya |
| 6,828,656 B2 | 12/2004 | Forbes et al. |
| 6,830,676 B2 | 12/2004 | Deevi |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,833,317 B2 | 12/2004 | Forbes et al. |
| 6,835,111 B2 | 12/2004 | Ahn et al. |
| 6,838,404 B2 | 1/2005 | Hentges et al. |
| 6,842,370 B2 | 1/2005 | Forbes |
| 6,844,203 B2 | 1/2005 | Ahn et al. |
| 6,844,256 B2 | 1/2005 | Forbes et al. |
| 6,844,260 B2 | 1/2005 | Sarigiannis et al. |
| 6,844,319 B1 | 1/2005 | Poelstra et al. |
| 6,846,574 B2 | 1/2005 | Subramanian |
| 6,846,738 B2 | 1/2005 | Forbes et al. |
| 6,852,167 B2 | 2/2005 | Ahn |
| 6,852,613 B2 | 2/2005 | Forbes et al. |
| 6,853,587 B2 | 2/2005 | Forbes |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,863,725 B2 | 3/2005 | Vaartstra et al. |
| 6,863,933 B2 | 3/2005 | Cramer et al. |
| 6,884,706 B2 | 4/2005 | Forbes et al. |
| 6,884,719 B2 | 4/2005 | Chang et al. |
| 6,884,739 B2 | 4/2005 | Ahn et al. |
| 6,887,758 B2 | 5/2005 | Chindalore et al. |
| 6,888,739 B2 | 5/2005 | Forbes |
| 6,890,843 B2 | 5/2005 | Forbes et al. |
| 6,893,984 B2 | 5/2005 | Ahn et al. |
| 6,900,116 B2 | 5/2005 | Forbes et al. |
| 6,900,122 B2 | 5/2005 | Ahn et al. |
| 6,900,481 B2 | 5/2005 | Jin et al. |
| 6,903,003 B2 | 6/2005 | Forbes et al. |
| 6,903,367 B2 | 6/2005 | Forbes |
| 6,903,444 B2 | 6/2005 | Forbes et al. |
| 6,906,402 B2 | 6/2005 | Forbes et al. |
| 6,914,278 B2 | 7/2005 | Forbes et al. |
| 6,914,800 B2 | 7/2005 | Ahn et al. |
| 6,919,266 B2 | 7/2005 | Ahn et al. |
| 6,921,702 B2 | 7/2005 | Ahn et al. |
| 6,929,830 B2 | 8/2005 | Tei et al. |
| 6,930,346 B2 | 8/2005 | Ahn et al. |
| 6,933,225 B2 | 8/2005 | Werkhoven et al. |
| 6,952,032 B2 | 10/2005 | Forbes et al. |
| 6,953,730 B2 | 10/2005 | Ahn et al. |
| 6,955,968 B2 | 10/2005 | Forbes et al. |
| 6,958,300 B2 | 10/2005 | Vaartstra et al. |
| 6,958,302 B2 | 10/2005 | Ahn et al. |
| 6,958,937 B2 | 10/2005 | Forbes et al. |
| 6,960,538 B2 | 11/2005 | Ahn et al. |
| 6,963,103 B2 | 11/2005 | Forbes |
| 6,967,159 B2 | 11/2005 | Vaartstra |
| 6,970,053 B2 | 11/2005 | Akram et al. |
| 6,979,855 B2 | 12/2005 | Ahn et al. |
| 6,984,592 B2 | 1/2006 | Vaartstra |
| 6,989,573 B2 | 1/2006 | Ahn et al. |
| 6,995,057 B2 | 2/2006 | Forbes et al. |
| 6,995,081 B2 | 2/2006 | Vaartstra |
| 7,012,297 B2 | 3/2006 | Bhattacharyya |
| 7,012,311 B2 | 3/2006 | Ohmi et al. |
| 7,015,525 B2 | 3/2006 | Forbes et al. |
| 7,026,694 B2 | 4/2006 | Ahn et al. |

| | | | | | | |
|---|---|---|---|---|---|---|
| 7,030,042 B2 | 4/2006 | Vaartstra et al. | | 7,531,869 B2 | 5/2009 | Ahn et al. |
| 7,037,574 B2 * | 5/2006 | Paranjpe et al. ............. 428/200 | | 2001/0002280 A1 | 5/2001 | Sneh |
| 7,041,609 B2 | 5/2006 | Vaartstra | | 2001/0002582 A1 | 6/2001 | Dunham |
| 7,042,043 B2 | 5/2006 | Forbes et al. | | 2001/0009383 A1 | 7/2001 | Nakayama et al. |
| 7,045,430 B2 | 5/2006 | Ahn et al. | | 2001/0009695 A1 | 7/2001 | Saanila et al. |
| 7,049,192 B2 | 5/2006 | Ahn et al. | | 2001/0010957 A1 | 8/2001 | Forbes et al. |
| 7,064,058 B2 | 6/2006 | Ahn et al. | | 2001/0012698 A1 | 8/2001 | Hayashi et al. |
| 7,068,544 B2 | 6/2006 | Forbes et al. | | 2001/0024387 A1 | 9/2001 | Raaijmakers et al. |
| 7,074,673 B2 | 7/2006 | Forbes | | 2001/0030352 A1 | 10/2001 | Ruf et al. |
| 7,075,829 B2 | 7/2006 | Forbes | | 2001/0042505 A1 | 11/2001 | Vaartstra |
| 7,077,902 B2 | 7/2006 | Vaartstra | | 2001/0051406 A1 | 12/2001 | Weimer et al. |
| 7,081,421 B2 | 7/2006 | Ahn et al. | | 2001/0051442 A1 | 12/2001 | Katsir et al. |
| 7,084,078 B2 | 8/2006 | Ahn et al. | | 2001/0053096 A1 | 12/2001 | Forbes et al. |
| 7,087,481 B2 | 8/2006 | Vaartstra et al. | | 2001/0053577 A1 | 12/2001 | Forbes et al. |
| 7,087,954 B2 | 8/2006 | Forbes | | 2002/0000593 A1 | 1/2002 | Nishiyama et al. |
| 7,101,813 B2 | 9/2006 | Ahn et al. | | 2002/0001219 A1 | 1/2002 | Forbes et al. |
| 7,112,485 B2 | 9/2006 | Vaartstra | | 2002/0001971 A1 | 1/2002 | Cho |
| 7,115,166 B2 | 10/2006 | Vaartstra et al. | | 2002/0004276 A1 | 1/2002 | Ahn et al. |
| 7,115,528 B2 | 10/2006 | Vaartstra et al. | | 2002/0004277 A1 | 1/2002 | Ahn et al. |
| 7,115,566 B2 | 10/2006 | Vaartstra et al. | | 2002/0004279 A1 | 1/2002 | Agarwal et al. |
| 7,122,464 B2 | 10/2006 | Vaartstra | | 2002/0013052 A1 | 1/2002 | Visokay |
| 7,125,815 B2 | 10/2006 | Vaartstra | | 2002/0019116 A1 | 2/2002 | Sandhu et al. |
| 7,129,553 B2 | 10/2006 | Ahn et al. | | 2002/0019125 A1 | 2/2002 | Juengling et al. |
| 7,135,369 B2 | 11/2006 | Ahn et al. | | 2002/0020429 A1 | 2/2002 | Selbrede |
| 7,135,421 B2 | 11/2006 | Ahn et al. | | 2002/0022156 A1 | 2/2002 | Bright |
| 7,138,336 B2 | 11/2006 | Lee et al. | | 2002/0024080 A1 | 2/2002 | Derderian et al. |
| 7,154,354 B2 | 12/2006 | Akram et al. | | 2002/0025628 A1 | 2/2002 | Derderian et al. |
| 7,160,577 B2 * | 1/2007 | Ahn et al. ............... 427/255.31 | | 2002/0028541 A1 | 3/2002 | Lee et al. |
| 7,160,817 B2 | 1/2007 | Marsh | | 2002/0037320 A1 | 3/2002 | Denes et al. |
| 7,166,886 B2 | 1/2007 | Forbes | | 2002/0037603 A1 | 3/2002 | Eldridge et al. |
| 7,169,673 B2 | 1/2007 | Ahn et al. | | 2002/0046705 A1 | 4/2002 | Sandhu et al. |
| 7,183,186 B2 | 2/2007 | Ahn et al. | | 2002/0046993 A1 | 4/2002 | Peterson et al. |
| 7,187,587 B2 | 3/2007 | Forbes | | 2002/0051859 A1 | 5/2002 | Iida et al. |
| 7,192,824 B2 | 3/2007 | Ahn et al. | | 2002/0053869 A1 | 5/2002 | Ahn et al. |
| 7,192,892 B2 | 3/2007 | Ahn et al. | | 2002/0058578 A1 | 5/2002 | Shindo |
| 7,195,999 B2 | 3/2007 | Forbes et al. | | 2002/0068466 A1 | 6/2002 | Lee et al. |
| 7,196,007 B2 | 3/2007 | Vaartstra | | 2002/0072164 A1 | 6/2002 | Umotoy et al. |
| 7,199,023 B2 | 4/2007 | Ahn et al. | | 2002/0076070 A1 | 6/2002 | Yoshikawa et al. |
| 7,205,218 B2 | 4/2007 | Ahn et al. | | 2002/0083464 A1 | 6/2002 | Tomsen et al. |
| 7,211,492 B2 | 5/2007 | Forbes et al. | | 2002/0084480 A1 | 7/2002 | Basceri et al. |
| 7,214,994 B2 | 5/2007 | Forbes et al. | | 2002/0086507 A1 | 7/2002 | Park et al. |
| 7,221,017 B2 | 5/2007 | Forbes et al. | | 2002/0086521 A1 | 7/2002 | Ahn et al. |
| 7,221,586 B2 | 5/2007 | Forbes et al. | | 2002/0086555 A1 | 7/2002 | Ahn et al. |
| 7,235,501 B2 | 6/2007 | Ahn et al. | | 2002/0089023 A1 | 7/2002 | Yu et al. |
| 7,235,854 B2 | 6/2007 | Ahn et al. | | 2002/0089063 A1 | 7/2002 | Ahn et al. |
| 7,250,367 B2 | 7/2007 | Vaartstra et al. | | 2002/0090806 A1 | 7/2002 | Ahn et al. |
| 7,253,122 B2 | 8/2007 | Vaartstra | | 2002/0094632 A1 | 7/2002 | Agarwal et al. |
| 7,271,077 B2 | 9/2007 | Vaartstra et al. | | 2002/0100418 A1 | 8/2002 | Sandhu et al. |
| 7,274,067 B2 | 9/2007 | Forbes | | 2002/0102818 A1 | 8/2002 | Sandhu et al. |
| 7,294,556 B2 | 11/2007 | Vaartstra | | 2002/0105087 A1 | 8/2002 | Forbes et al. |
| 7,300,870 B2 | 11/2007 | Vaartstra | | 2002/0109138 A1 | 8/2002 | Forbes |
| 7,309,664 B1 | 12/2007 | Marzolin et al. | | 2002/0109163 A1 | 8/2002 | Forbes et al. |
| 7,312,494 B2 | 12/2007 | Ahn et al. | | 2002/0110991 A1 | 8/2002 | Li |
| 7,326,980 B2 | 2/2008 | Ahn et al. | | 2002/0111001 A1 | 8/2002 | Ahn |
| 7,332,442 B2 | 2/2008 | Vaartstra et al. | | 2002/0113261 A1 | 8/2002 | Iwasaki et al. |
| 7,374,617 B2 | 3/2008 | Vaartstra | | 2002/0117704 A1 | 8/2002 | Gonzalez |
| 7,365,027 B2 | 4/2008 | Ahn et al. | | 2002/0117963 A1 | 8/2002 | Chuman et al. |
| 7,368,402 B2 | 5/2008 | Vaartstra | | 2002/0119297 A1 | 8/2002 | Forrest et al. |
| 7,374,964 B2 | 5/2008 | Ahn et al. | | 2002/0119916 A1 | 8/2002 | Hassan |
| 7,388,246 B2 | 6/2008 | Ahn et al. | | 2002/0120297 A1 | 8/2002 | Shadduck |
| 7,390,756 B2 | 6/2008 | Ahn et al. | | 2002/0122885 A1 * | 9/2002 | Ahn ..................... 427/255.28 |
| 7,402,876 B2 | 7/2008 | Ahn et al. | | 2002/0125490 A1 | 9/2002 | Chuman et al. |
| 7,405,454 B2 | 7/2008 | Ahn et al. | | 2002/0130338 A1 | 9/2002 | Ahn et al. |
| 7,410,668 B2 | 8/2008 | Ahn | | 2002/0130378 A1 | 9/2002 | Forbes et al. |
| 7,410,910 B2 | 8/2008 | Ahn et al. | | 2002/0132374 A1 * | 9/2002 | Basceri et al. ................. 438/3 |
| 7,410,917 B2 | 8/2008 | Ahn et al. | | 2002/0135048 A1 | 9/2002 | Ahn et al. |
| 7,410,918 B2 | 8/2008 | Vaartstra | | 2002/0137271 A1 | 9/2002 | Forbes et al. |
| 7,411,237 B2 | 8/2008 | Ahn et al. | | 2002/0142536 A1 | 10/2002 | Zhang et al. |
| 7,439,194 B2 | 10/2008 | Ahn et al. | | 2002/0142569 A1 | 10/2002 | Chang et al. |
| 7,508,025 B2 | 3/2009 | Eldridge et al. | | 2002/0145845 A1 | 10/2002 | Hunt et al. |
| 7,508,648 B2 | 3/2009 | Ahn et al. | | 2002/0145901 A1 | 10/2002 | Forbes et al. |
| 7,510,983 B2 | 3/2009 | Ahn et al. | | 2002/0146916 A1 | 10/2002 | Irino et al. |
| 7,518,246 B2 | 4/2009 | Ahn et al. | | 2002/0148566 A1 | 10/2002 | Kitano et al. |

| | | | | | |
|---|---|---|---|---|---|
| 2002/0155688 A1 | 10/2002 | Ahn | 2003/0170403 A1 | 9/2003 | Doan et al. |
| 2002/0155689 A1 | 10/2002 | Ahn | 2003/0172872 A1 | 9/2003 | Thakur et al. |
| 2002/0164420 A1 | 11/2002 | Derderian et al. | 2003/0173652 A1 | 9/2003 | Forbes et al. |
| 2002/0167057 A1 | 11/2002 | Ahn et al. | 2003/0173653 A1 | 9/2003 | Forbes et al. |
| 2002/0167089 A1 | 11/2002 | Ahn et al. | 2003/0174529 A1 | 9/2003 | Forbes et al. |
| 2002/0170671 A1 | 11/2002 | Matsuhita et al. | 2003/0175411 A1 | 9/2003 | Kodas et al. |
| 2002/0172799 A1 | 11/2002 | Subramanian | 2003/0176023 A1 | 9/2003 | Forbes et al. |
| 2002/0175423 A1 | 11/2002 | Forbes et al. | 2003/0176025 A1 | 9/2003 | Forbes et al. |
| 2002/0176989 A1 | 11/2002 | Knudsen et al. | 2003/0176049 A1 | 9/2003 | Hegde et al. |
| 2002/0177244 A1 | 11/2002 | Hsu et al. | 2003/0176050 A1 | 9/2003 | Forbes et al. |
| 2002/0177282 A1 | 11/2002 | Song | 2003/0176052 A1 | 9/2003 | Forbes et al. |
| 2002/0187091 A1 | 12/2002 | Deevi | 2003/0176053 A1 | 9/2003 | Forbes et al. |
| 2002/0190251 A1 | 12/2002 | Kunitake et al. | 2003/0176065 A1 | 9/2003 | Vaartstra |
| 2002/0192366 A1 | 12/2002 | Cramer et al. | 2003/0181039 A1 | 9/2003 | Sandhu et al. |
| 2002/0192974 A1 | 12/2002 | Ahn et al. | 2003/0183156 A1 | 10/2003 | Dando et al. |
| 2002/0192975 A1 | 12/2002 | Ahn | 2003/0194861 A1 | 10/2003 | Mardian et al. |
| 2002/0192979 A1 | 12/2002 | Ahn | 2003/0194862 A1 | 10/2003 | Mardian |
| 2002/0193040 A1 | 12/2002 | Zhou | 2003/0196513 A1 | 10/2003 | Phillips et al. |
| 2002/0195056 A1 | 12/2002 | Sandhu et al. | 2003/0200917 A1 | 10/2003 | Vaartstra |
| 2002/0196405 A1 | 12/2002 | Colgan et al. | 2003/0203626 A1 | 10/2003 | Derderian et al. |
| 2002/0197881 A1 | 12/2002 | Ramdani et al. | 2003/0207032 A1 | 11/2003 | Ahn et al. |
| 2003/0001190 A1 | 1/2003 | Basceri et al. | 2003/0207540 A1 | 11/2003 | Ahn et al. |
| 2003/0001212 A1 | 1/2003 | Hu et al. | 2003/0207564 A1 | 11/2003 | Ahn et al. |
| 2003/0001241 A1 | 1/2003 | Chakrabarti et al. | 2003/0207566 A1 | 11/2003 | Forbes et al. |
| 2003/0003635 A1 | 1/2003 | Paranjpe et al. | 2003/0207593 A1 | 11/2003 | Derderian et al. |
| 2003/0003702 A1 | 1/2003 | Ahn | 2003/0209324 A1 | 11/2003 | Fink |
| 2003/0003722 A1 | 1/2003 | Vaartstra | 2003/0213987 A1 | 11/2003 | Basceri |
| 2003/0003730 A1 | 1/2003 | Li | 2003/0218199 A1 | 11/2003 | Forbes et al. |
| 2003/0004051 A1 | 1/2003 | Kim et al. | 2003/0222300 A1 | 12/2003 | Basceri et al. |
| 2003/0008243 A1 | 1/2003 | Ahn et al. | 2003/0224600 A1 | 12/2003 | Cao et al. |
| 2003/0008461 A1 | 1/2003 | Forbes et al. | 2003/0227033 A1 | 12/2003 | Ahn et al. |
| 2003/0017717 A1 | 1/2003 | Ahn et al. | 2003/0228747 A1 | 12/2003 | Ahn et al. |
| 2003/0020169 A1 | 1/2003 | Ahn et al. | 2003/0232511 A1 | 12/2003 | Metzner et al. |
| 2003/0020180 A1 | 1/2003 | Ahn et al. | 2003/0234420 A1 | 12/2003 | Forbes |
| 2003/0020429 A1 | 1/2003 | Masaki et al. | 2003/0235066 A1 | 12/2003 | Forbes |
| 2003/0026697 A1 | 2/2003 | Subramanian et al. | 2003/0235076 A1 | 12/2003 | Forbes |
| 2003/0027360 A1 | 2/2003 | Hsu et al. | 2003/0235961 A1 | 12/2003 | Metzner et al. |
| 2003/0030074 A1 | 2/2003 | Walker et al. | 2004/0004244 A1 | 1/2004 | Ahn et al. |
| 2003/0032270 A1 | 2/2003 | Synder et al. | 2004/0004245 A1 | 1/2004 | Forbes et al. |
| 2003/0040196 A1 | 2/2003 | Lim et al. | 2004/0004247 A1 | 1/2004 | Forbes et al. |
| 2003/0042512 A1 | 3/2003 | Gonzalez | 2004/0004859 A1 | 1/2004 | Forbes et al. |
| 2003/0042526 A1 | 3/2003 | Weimer | 2004/0007171 A1 | 1/2004 | Ritala et al. |
| 2003/0043637 A1 | 3/2003 | Forbes et al. | 2004/0009679 A1 | 1/2004 | Yeo et al. |
| 2003/0045060 A1 | 3/2003 | Ahn et al. | 2004/0016944 A1 | 1/2004 | Ahn et al. |
| 2003/0045078 A1 | 3/2003 | Ahn et al. | 2004/0023461 A1 | 2/2004 | Ahn et al. |
| 2003/0045082 A1 | 3/2003 | Eldridge et al. | 2004/0028811 A1 | 2/2004 | Cho et al. |
| 2003/0048666 A1 | 3/2003 | Eldridge et al. | 2004/0032773 A1 | 2/2004 | Forbes |
| 2003/0048745 A1 | 3/2003 | Yoshikawa et al. | 2004/0033661 A1 | 2/2004 | Yeo et al. |
| 2003/0049900 A1 | 3/2003 | Forbes et al. | 2004/0033681 A1 | 2/2004 | Ahn et al. |
| 2003/0049942 A1 | 3/2003 | Haukka et al. | 2004/0033701 A1 | 2/2004 | Ahn et al. |
| 2003/0052356 A1 | 3/2003 | Yang | 2004/0036129 A1 | 2/2004 | Forbes et al. |
| 2003/0052358 A1 | 3/2003 | Weimer | 2004/0038525 A1 | 2/2004 | Meng et al. |
| 2003/0059535 A1 | 3/2003 | Luo et al. | 2004/0038554 A1 | 2/2004 | Ahn |
| 2003/0064607 A1 | 4/2003 | Leu et al. | 2004/0040501 A1 | 3/2004 | Vaartstra |
| 2003/0089314 A1 | 5/2003 | Matsuki et al. | 2004/0042256 A1 | 3/2004 | Forbes |
| 2003/0102501 A1 | 6/2003 | Yang et al. | 2004/0043151 A1 | 3/2004 | Vaartstra |
| 2003/0104666 A1 | 6/2003 | Bojarczuk, Jr. et al. | 2004/0043541 A1 | 3/2004 | Anh et al. |
| 2003/0106490 A1* | 6/2003 | Jallepally et al. ............... 117/89 | 2004/0043557 A1 | 3/2004 | Haukka et al. |
| 2003/0107402 A1 | 6/2003 | Forbes et al. | 2004/0043569 A1 | 3/2004 | Ahn et al. |
| 2003/0119246 A1 | 6/2003 | Ahn | 2004/0043600 A1 | 3/2004 | Vaartstra |
| 2003/0119291 A1 | 6/2003 | Ahn et al. | 2004/0043604 A1 | 3/2004 | Vaartstra |
| 2003/0119313 A1 | 6/2003 | Yang et al. | 2004/0043625 A1 | 3/2004 | Vaartstra et al. |
| 2003/0130127 A1 | 7/2003 | Hentges et al. | 2004/0043630 A1 | 3/2004 | Vaartstra et al. |
| 2003/0132491 A1 | 7/2003 | Ahn | 2004/0043632 A1 | 3/2004 | Vaartstra |
| 2003/0139039 A1 | 7/2003 | Ahn et al. | 2004/0043633 A1 | 3/2004 | Vaartstra |
| 2003/0141560 A1 | 7/2003 | Sun | 2004/0043634 A1 | 3/2004 | Vaartstra |
| 2003/0142569 A1 | 7/2003 | Forbes | 2004/0043635 A1 | 3/2004 | Vaartstra |
| 2003/0143801 A1 | 7/2003 | Basceri et al. | 2004/0043636 A1 | 3/2004 | Vaartstra et al. |
| 2003/0148577 A1 | 8/2003 | Merkulov et al. | 2004/0065255 A1 | 4/2004 | Yang et al. |
| 2003/0152700 A1 | 8/2003 | Asmussen et al. | 2004/0086897 A1 | 5/2004 | Mirkin et al. |
| 2003/0157764 A1 | 8/2003 | Ahn et al. | 2004/0087124 A1 | 5/2004 | Kubota et al. |
| 2003/0159653 A1 | 8/2003 | Dando et al. | 2004/0099889 A1 | 5/2004 | Frank et al. |
| 2003/0170389 A1 | 9/2003 | Sandhu | 2004/0110348 A1 | 6/2004 | Ahn et al. |

| | | |
|---|---|---|
| 2004/0110391 A1 | 6/2004 | Ahn et al. |
| 2004/0126954 A1 | 7/2004 | Vaartstra et al. |
| 2004/0130951 A1 | 7/2004 | Forbes |
| 2004/0140513 A1 | 7/2004 | Forbes et al. |
| 2004/0144980 A1 | 7/2004 | Ahn et al. |
| 2004/0152254 A1 | 8/2004 | Vaartstra et al. |
| 2004/0164357 A1 | 8/2004 | Ahn et al. |
| 2004/0164365 A1 | 8/2004 | Ahn et al. |
| 2004/0165412 A1 | 8/2004 | Forbes |
| 2004/0168627 A1 | 9/2004 | Conley, Jr. et al. |
| 2004/0169453 A1 | 9/2004 | Ahn et al. |
| 2004/0171280 A1 | 9/2004 | Conley, Jr. et al. |
| 2004/0175882 A1 | 9/2004 | Ahn et al. |
| 2004/0178439 A1 | 9/2004 | Ahn et al. |
| 2004/0183108 A1 | 9/2004 | Ahn |
| 2004/0185630 A1 | 9/2004 | Forbes et al. |
| 2004/0185654 A1 | 9/2004 | Ahn et al. |
| 2004/0187968 A1 | 9/2004 | Vaartstra |
| 2004/0189175 A1 | 9/2004 | Ahn et al. |
| 2004/0197946 A1 | 10/2004 | Vaartstra et al. |
| 2004/0202032 A1 | 10/2004 | Forbes |
| 2004/0203254 A1 | 10/2004 | Conley, Jr. et al. |
| 2004/0214399 A1 | 10/2004 | Ahn et al. |
| 2004/0219746 A1 | 11/2004 | Vaartstra et al. |
| 2004/0219783 A1 | 11/2004 | Ahn et al. |
| 2004/0222476 A1 | 11/2004 | Ahn et al. |
| 2004/0224505 A1 | 11/2004 | Nguyen et al. |
| 2004/0235313 A1 | 11/2004 | Frank et al. |
| 2004/0248398 A1 | 12/2004 | Ahn et al. |
| 2004/0262700 A1 | 12/2004 | Ahn et al. |
| 2004/0266217 A1 | 12/2004 | Kim et al. |
| 2005/0006727 A1 | 1/2005 | Forbes et al. |
| 2005/0007817 A1 | 1/2005 | Forbes et al. |
| 2005/0009266 A1 | 1/2005 | Vaartstra |
| 2005/0009335 A1 | 1/2005 | Dean et al. |
| 2005/0009368 A1 | 1/2005 | Vaartstra |
| 2005/0009370 A1 | 1/2005 | Ahn |
| 2005/0017327 A1 | 1/2005 | Forbes et al. |
| 2005/0019978 A1 | 1/2005 | Vaartstra et al. |
| 2005/0020017 A1 | 1/2005 | Ahn et al. |
| 2005/0023574 A1 | 2/2005 | Forbes et al. |
| 2005/0023578 A1 | 2/2005 | Bhattacharyya |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0023650 A1 | 2/2005 | Forbes et al. |
| 2005/0024092 A1 | 2/2005 | Forbes |
| 2005/0026349 A1 | 2/2005 | Forbes et al. |
| 2005/0026374 A1 | 2/2005 | Ahn et al. |
| 2005/0026375 A1 | 2/2005 | Forbes |
| 2005/0026458 A1 | 2/2005 | Basceri et al. |
| 2005/0028733 A1 | 2/2005 | Vaartstra |
| 2005/0029545 A1 | 2/2005 | Forbes et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030803 A1 | 2/2005 | Forbes et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0032360 A1 | 2/2005 | Vaartstra |
| 2005/0034662 A1 | 2/2005 | Ahn |
| 2005/0036370 A1 | 2/2005 | Forbes |
| 2005/0037563 A1 | 2/2005 | Ahn |
| 2005/0040034 A1 | 2/2005 | Landgraf et al. |
| 2005/0054165 A1 | 3/2005 | Ahn et al. |
| 2005/0077519 A1 | 4/2005 | Ahn et al. |
| 2005/0087134 A1 | 4/2005 | Ahn |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0136689 A9 | 6/2005 | Vaartstra |
| 2005/0138262 A1 | 6/2005 | Forbes |
| 2005/0145911 A1 | 7/2005 | Forbes et al. |
| 2005/0145957 A1 | 7/2005 | Ahn et al. |
| 2005/0145959 A1 | 7/2005 | Forbes |
| 2005/0158973 A1 | 7/2005 | Ahn et al. |
| 2005/0160981 A9 | 7/2005 | Vaartstra |
| 2005/0164521 A1 | 7/2005 | Ahn et al. |
| 2005/0169054 A1 | 8/2005 | Forbes |
| 2005/0190617 A1 | 9/2005 | Forbes et al. |
| 2005/0221006 A1 | 10/2005 | Vaartstra |
| 2005/0227442 A1 | 10/2005 | Ahn et al. |
| 2005/0260357 A1 | 11/2005 | Olsen et al. |
| 2005/0277256 A1 | 12/2005 | Ahn et al. |
| 2005/0280067 A1 | 12/2005 | Ahn et al. |
| 2005/0285225 A1 | 12/2005 | Ahn et al. |
| 2005/0287804 A1 | 12/2005 | Vaartstra |
| 2005/0287819 A1 | 12/2005 | Vaartstra et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0008966 A1 | 1/2006 | Forbes et al. |
| 2006/0023513 A1 | 2/2006 | Forbes et al. |
| 2006/0024975 A1 | 2/2006 | Ahn et al. |
| 2006/0028867 A1 | 2/2006 | Forbes et al. |
| 2006/0028869 A1 | 2/2006 | Forbes et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0231889 A1 | 10/2006 | Chen et al. |
| 2006/0237764 A1 | 10/2006 | Ahn et al. |
| 2006/0244082 A1 | 11/2006 | Ahn et al. |
| 2006/0244100 A1 | 11/2006 | Ahn et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0258097 A1 | 11/2006 | Forbes et al. |
| 2006/0258175 A1 | 11/2006 | Vaartstra et al. |
| 2006/0261376 A1 | 11/2006 | Forbes et al. |
| 2006/0261389 A1 | 11/2006 | Vaartstra |
| 2006/0261397 A1 | 11/2006 | Ahn et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0270147 A1 | 11/2006 | Ahn et al. |
| 2006/0274580 A1 | 12/2006 | Forbes |
| 2006/0281330 A1 | 12/2006 | Ahn et al. |
| 2006/0284246 A1 | 12/2006 | Forbes et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |

| | | | |
|---|---|---|---|
| 2007/0010061 A1 | 1/2007 | Forbes et al. | |
| 2007/0018214 A1 | 1/2007 | Ahn | |
| 2007/0020835 A1 | 1/2007 | Ahn et al. | |
| 2007/0037415 A1 | 2/2007 | Ahn et al. | |
| 2007/0045676 A1 | 3/2007 | Forbes et al. | |
| 2007/0045752 A1 | 3/2007 | Forbes et al. | |
| 2007/0048926 A1 | 3/2007 | Ahn | |
| 2007/0048989 A1 | 3/2007 | Ahn et al. | |
| 2007/0049023 A1 | 3/2007 | Ahn et al. | |
| 2007/0049051 A1 | 3/2007 | Ahn et al. | |
| 2007/0049054 A1 | 3/2007 | Ahn et al. | |
| 2007/0059881 A1 | 3/2007 | Ahn et al. | |
| 2007/0087563 A1 | 4/2007 | Ahn et al. | |
| 2007/0090439 A1 | 4/2007 | Ahn et al. | |
| 2007/0090440 A1 | 4/2007 | Ahn et al. | |
| 2007/0090441 A1 | 4/2007 | Ahn et al. | |
| 2007/0092989 A1 | 4/2007 | Kraus et al. | |
| 2007/0099366 A1 | 5/2007 | Ahn et al. | |
| 2007/0105313 A1 | 5/2007 | Forbes | |
| 2007/0107661 A1 | 5/2007 | Ahn | |
| 2007/0111544 A1 | 5/2007 | Ahn et al. | |
| 2007/0131169 A1 | 6/2007 | Ahn | |
| 2007/0134931 A1 | 6/2007 | Ahn et al. | |
| 2007/0134942 A1 | 6/2007 | Ahn et al. | |
| 2007/0144438 A1 | 6/2007 | Vaartstra | |
| 2007/0155190 A1 | 7/2007 | Vaartstra et al. | |
| 2007/0158765 A1 | 7/2007 | Ahn et al. | |
| 2007/0161260 A1 | 7/2007 | Vaartstra | |
| 2007/0166999 A1 | 7/2007 | Vaartstra | |
| 2007/0178643 A1 | 8/2007 | Forbes et al. | |
| 2007/0181931 A1 | 8/2007 | Ahn et al. | |
| 2007/0187772 A1 | 8/2007 | Ahn et al. | |
| 2007/0187831 A1 | 8/2007 | Ahn et al. | |
| 2007/0234949 A1 | 10/2007 | Ahn et al. | |
| 2007/0295273 A1 | 12/2007 | Vaartstra | |
| 2008/0029790 A1 | 2/2008 | Ahn et al. | |
| 2008/0032424 A1 | 2/2008 | Ahn et al. | |
| 2008/0032465 A1 | 2/2008 | Ahn et al. | |
| 2008/0048225 A1 | 2/2008 | Ahn et al. | |
| 2008/0057659 A1 | 3/2008 | Forbes | |
| 2008/0057690 A1 | 3/2008 | Forbes | |
| 2008/0064210 A1 | 3/2008 | Vaartstra | |
| 2008/0087890 A1 | 4/2008 | Ahn et al. | |
| 2008/0087945 A1 | 4/2008 | Forbes et al. | |
| 2008/0102629 A1 | 5/2008 | Vaartstra | |
| 2008/0121962 A1 | 5/2008 | Forbes et al. | |
| 2008/0124907 A1 | 5/2008 | Forbes et al. | |
| 2008/0124908 A1 | 5/2008 | Forbes et al. | |
| 2008/0191350 A1 | 8/2008 | Ahn et al. | |
| 2008/0191351 A1 | 8/2008 | Ahn et al. | |
| 2008/0193791 A1 | 8/2008 | Ahn et al. | |
| 2008/0194094 A1 | 8/2008 | Ahn et al. | |
| 2008/0217676 A1 | 9/2008 | Ahn et al. | |
| 2008/0248618 A1 | 10/2008 | Ahn et al. | |
| 2008/0274625 A1 | 11/2008 | Ahn et al. | |

FOREIGN PATENT DOCUMENTS

| | | | |
|---|---|---|---|
| EP | 1324376 A1 | 7/2003 | |
| JP | 62-199019 | 9/1987 | |
| JP | 5090169 | 4/1993 | |
| JP | 07-320996 | 12/1995 | |
| JP | 09-293845 | 11/1997 | |
| JP | 11-335849 | 12/1999 | |
| JP | 2000-192241 | 7/2000 | |
| JP | 2001-332546 | 11/2001 | |
| WO | WO-0233729 A2 | 4/2002 | |
| WO | WO-2004079796 A3 | 9/2004 | |
| WO | WO-2006026716 | 3/2006 | |

OTHER PUBLICATIONS

"International Technology for Semiconductor Roadmap", http://public.itrs.net/Files/2001ITRS/Links/1999_SIA_Roadmap/, Semiconductor Industry Association,(1999).

Aarik, Jaan , "Atomic layer growth of epitaxial $TiO_2$ thin films from $TiCl_4$ and $H_2O$ on alpha -$Al_2O_3$ substrates", *Journal of Crystal Growth*, 242(1-2), (2002),189-198.

Aarik, Jaan , "Influence of substrate temperature on atomic layer growth and properties of $HfO_2$ thin films", *Thin Solid Films*, 340(1-2), (1999),110-116.

Aarik, Jaan , "Phase transformations in hafnium dioxide thin films grown by atomic layer deposition at high temperatures" , *Applied Surface Science*, 173(1-2), (Mar. 2001),15-21.

Aarik, Jaan , "Texture development in nanocrystalline hafnium dioxide thin films grown by atomic layer deposition", *Journal of Crystal Growth*, 220(1-2), (Nov. 15, 2000),105-113.

Abe, T , "Silicon Wafer-Bonding Process Technology for SOI Structures", *Extended Abstracts of the 22nd (1990 International) Conference on Solid State Devices and Materials*, (1990),853-856.

Adler, E. , et al., "The Evolution of IBM CMOS DRAM Technology", *IBM Journal of Research & Development*, 39(1-2), (Jan.-Mar. 1995),167-188.

Ahn, et al., "Ald of Zr-Substituted $BaTiO_3$ Films as Gate Dielectrics", U.S. Appl. No. 11/498,559, filed Aug. 3, 2006.

Ahn, K Y., "Atomic Layer Deposited Barium Strontium Titanium Oxide Films", U.S. Appl. No. 11/510,803, filed Aug. 26, 2006.

Ahn, Kie Y., "Atomic Layer Deposition of $GDSCO_3$ Films As Gate Dielectrics", U.S. Appl. No. 11/215,507, filed Aug. 30, 2005.

Ahn, Kie Y., "Cobalt Titanium Oxide Dielectric Films", U.S. Appl. No. 11/216,958, filed Aug. 31, 2005.

Ahn, Kie Y., "Gallium Lanthanide Oxide Films", (U.S. Appl. No. 11/329,025, filed Jan. 10, 2006.

Ahn, Kie Y., et al., "Hafnium Lanthanide Oxynitride Films", U.S. Appl. No. 11/515,143, filed Aug. 31, 2006.

Ahn, "Iridium / Zirconium Oxide Structure", U.S. Appl. No. 11/152,759, filed Jun. 14, 2005.

Ahn, Kie Y., et al., "Lanthanide Yttrium Aluminum Oxide Dielectric Films", U.S. Appl. No. 11/297,567, filed Dec. 8, 2005.

Ahn, Kie Y., "Lanthanum Aluminum Oxynitride Dielectric Films", U.S. Appl. No. 11/216,474, filed Aug. 31, 2005.

Ahn, Kie Y., et al., "Magnesium Titanium Oxide Films", U.S. Appl. No. 11/189,075, filed Jul. 25, 2005.

Ahn, Kie Y., "Magnesium-Doped Zinc Oxide Structures and Methods", U.S. Appl. No. 11/706,820, filed Feb. 13, 2007.

Ahn, Kie Y., et al., "Methods to Form Dielectric Structures in Semiconductor Devices and Resulting Devices", U.S. Appl. No. 11/581,675, filed Aug. 16, 2006.

Ahn, Kie Y., "Molybdenum-Doped Indium Oxide Structures and Methods", U.S. Appl. No. 11/706,944, filed Feb. 13, 2007.

Ahn, Kie Y., "Titanium Aluminum Oxide Films", U.S. Appl. No. 11/566,042, filed Dec. 1, 2006, 48 pgs.

Ahn, Kie Y., et al., "Tungsten-Doped Indium Oxide Structures and Methods", U.S. Appl. No. 11/706,498, filed Feb. 13, 2007.

Ahn, Kie Y., "Zirconium-Doped Gadolinium Oxide Films", U.S. Appl. No. 11/215,578, filed Aug. 29, 2005.

Ahn, Kie Y., et al., "Zirconium-Doped Zinc Oxide Structures and Methods", U.S. Appl. No. 11/707,173, filed Feb. 13, 2007.

Alen, Petra , "Atomic Layer deposition of Ta(Al)N(C) thin films using trimethylaluminum as a reducing agent", *Journal of the Electrochemical Society*, 148(10), (Oct. 2001), G566-G571.

Asai, S. , "Technology Challenges for Integration Near and Below 0.1 micrometer", *Proceedings of the IEEE*, 85(4), Special Issue on Nanometer-Scale Science & Technology,(Apr. 1997),505-520.

Auberton-Herve, A. J., "SOI: Materials to Systems", *Digest of the International Electron Device Meeting*, San Francisco,(Dec. 1996),3-10.

Banerjee, S. , "Applications of silicon-germanium-carbon in MOS and bipolar transistors", *Proceedings of the SPIE—The International Society for Optical Engineering*, 3212, (1997),118-128.

Banerjee, S. K., et al., "Characterization of Trench Transistors for 3-D Memories", *1986 Symposium on VLSI Technology, Digest of Technical Papers*, San Diego, CA, (May 1986), 79-80.

Beensh-Marchwicka, G., et al., "Preparation of thermosensitive magnetron sputtered thin films", *Vacuum*, 53(1-2), (May 1999), 47-52.

Bendoraitis, J G., et al., "Optical energy gaps in the monoclinic oxides of hafnium and zirconium and their solid solutions", *Journal of Physical Chemistry*, 69(10), (1965), 3666-3667.

Bengtsson, Stefan, et al., "Interface charge control of directly bonded silicon structures", *J. Appl. Phys.*, 66(3), (Aug. 1989), 1231-1239.

Blalock, T. N., et al., "A High-Speed Sensing Scheme for 1T Dynamic RAM's Utilizing the Clamped Bit-Line Sense Amplifier", *IEEE Journal of Solid-State Circuits*, 27(4), (Apr. 1992), pp. 618-624.

Bomchil, G., "Porous Silicon: The Material and its Applications in Silicon-On-Insulator Techologies", *Applied Surface Science*, 41/42, (1989), 604-613.

Braud, F., "Ultra Thin Diffusion Barriers for Cu Interconnections at The Gigabit Generation and Beyond", *VMIC Conference Proceedings*, (1996), 174-179

Bright, A A., et al., "Low-rate plasma oxidation of Si in a dilute oxygen/helium plasma for low-temperature gate quality $Si/SiO_2$ interfaces", *Applied Physics Letters*, 58(6), (Feb. 1991), 619-621.

Bunshah, Rointan F., et al., "Deposition Technologies for Films and Coatings: Developments and Applications", Park Ridge, N.J., U.S.A. : Noyes Publications, (1982), 102-103.

Burnett, D., "Implications of Fundamental Threshold Voltage Variations for High-Density SRAM and Logic Circuits", *1994 Symposium on VLSI Technology, Digest of Technical Papers*, Honolulu, HI, (Jun. 1994), 15-16.

Burnett, D., "Statistical Threshold-Voltage Variation and its Impact on Supply-Voltage Scaling", *Proceedings SPIE: Microelectronic Device and Multilevel Interconnection Technology*, 2636, (1995), 83-90.

Callegari, A., et al., "Physical and electrical characterization of Hafnium oxide and Hafnium silicate sputtered films", *Journal of Applied Physics*, 90(12), (Dec. 15, 2001), 6466-75.

Cartagena, E, et al., "Bonded Etchback Silicon on Sapphire Bipolar Junction Transistors", *Extended Abstracts—Electrochemical Society*(1), Program and Abstracts: 183rd Meeting of the Electrochemical Society, Pennington, NJ,(1993), 191.

Cava, R. J., et al., "Improvement of the dielectric properties of $Ta_2O_5$ through substitution with $Al_2O_3$", *Applied Physics Letters*, 70(11), (Mar. 1997), 1396-8.

Chang, Hyo S., et al., "Excellent thermal stability of $Al_2O_3/ZrO_2/Al_2O_3$ stack structure of metal-oxide-semiconductor gate dielectrics application", *Applied Physics Letters*, 80(19), (May 6, 2002), 3385-7.

Chen, M. J., et al., "Back-Gate Forward Bias Method for Low-Voltage CMOS Digital Cicuits", *IEEE Transactions on Electron Devices*, 43, (Jun. 1996), 904-909.

Chen, M. J., et al., "Optimizing the Match in Weakly Inverted MOSFET's by Gated Lateral Bipolar Action", *IEEE Transactions on Electron Devices*, 43, (May 1996), 766-773.

Chen, P. J., et al., "Thermal stability and scalability of Zr-aluminate-based high-k gate stacks", *Symposium on VLSI Technology Digest*, (2002), 192-3.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999), 1537-1544.

Chesler, R., et al., "Solid-State Ionic Lasers", In: *Laser Handbook*, vol. 1, Arecchi, F.T., et al., (eds.), North-Holland Publishing Company, Amsterdam,(1972),p. 353.

Chin, A., et al., "High Quality $La_2O_3$ and $Al_2O_3$ Gate Dielectrics with Equivalent Oxide Thickness 5-10A", *Digest of Technical Papers. 2000 Symposium on VLSI Technology, 2000*, Honolulu,(Jun. 13-15, 2000), 16-17.

Chung, I. Y., et al., "A New SOI Inverter for Low Power Applications", *Proceedings of the 1996 IEEE International SOI Conference*, Sanibel Island, FL,(1996), 20-21.

Clark, P, "IMEC Highlights Hafnium, Metal Gates for High-k Integration", *Semiconductor Business News*, at Silicon Strategies.com, (Oct. 11, 2002), 2 pages.

Colombo, D., et al., "Anhydrous Metal Nitrates as Volatile Single Source Precursors for the CVD of Metal Oxide Films", *Communications, Department of EE*, U of M, Mpls, MN, (Jul. 7, 1998), 3 pages.

Conley, Jr., J. F., et al., "Atomic Layer Deposition of Hafnium Oxide Using Anhydrous Hafnium Nitrate", *Electrochemical and Solid-State Letters*, 5(5), (2002), C57-C59.

Copel, M., et al., "Formation of a stratified lanthanum silicate dielectric by reaction with Si(001)", *Applied Physics Letters*, 78(11), (Mar. 12, 2001), 1607-1609.

Copel, M., et al., "Structure and stability of ultrathin zirconium oxide layers on Si(001)", *Applied Physics Letters*, 76(4), (Jan. 2000), 436-438.

Da Rosa, E B., et al., "Annealing of $ZrAl_xO_y$ ultrathin films on Si in a vacuum or in $O_2$", *Journal of the Electrochemical Society*, 148 (12), (Dec. 2001), G695-G703.

Dalal, Vikram L., et al., "Microcrystalline Germanium Carbide—A new material for PV conversion", *Presented at 2001 NCPV Program Review Meeting*, (2001), 348-349.

De, V. K., "Radom MOSFET Parameter Fluctuation Limits to Gigascale Integration (GSI)", *1996 Symposium on VLSI Technology, Digest of Technical Papers*, Honolulu, HI, (Jun. 11-13, 1996), 198-199.

De Flaviis, Franco, et al., "Planar microwave integrated phase-shifter design with high purity ferroelectric material", *IEEE Transactions on Microwave Theory & Techniques*, 45(6), (Jun. 1997), 963-969.

Denton, Jack P., et al., "Fully depleted dual-gated thin-film SOI P-MOSFETs fabricated in SOI islands with an isolated buried polysilicon backgate", *IEEE Electron Device Letters*, 17(11), (Nov. 1996), 509-511.

Desu, S B., "Minimization of Fatigue in Ferroelectric Films", *Physica Status Solidi A*, 151(2), (1995), 467-480.

Dimoulas, A., et al., "Structural and electrical quality of the high-k dielectric $Y2O_3$ on Si (001): Dependence on growth parameters", *Journal of Applied Physics*, 92(1), (Jul. 1, 2002), 426-431.

Ding, "Copper Barrier, Seed Layer and Planarization Technologies", *VMIC Conference Proceedings*, (1997), 87-92.

Ducso, C, et al., "Deposition of tin oxide into porous silicon by atomic layer epitaxy", *Journal of the Electrochemical Society*, 143, (1996), 683-687.

El-Kareh, B, et al., "The evolution of DRAM cell technology", *Solid State Technology*, 40(5), (1997), 89-90, 92, 95-6, 98, 100-1.

Engelhardt, M., "Modern Applications of Plasma Etching and Patterning in Silicon Process Technology", *Contributions to Plasma Physics*, 39(5), (1999), 473-478.

Fong, Y., "Oxides Grown on Textured Single-Crystal Silicon—Dependence on Process and Application in EEPROMs", *IEEE Transactions on Electron Devices*, 37(3), (Mar. 1990), 583-590.

Forbes, "Hafnium Aluminum Oxynitride High-K Dielectric and Metal Gates", U.S. Appl. No. 11/514,558, filed Aug. 31, 2006.

Forbes, "Hafnium Tantalum Oxynitride High-K Dielectric and Metal Gates", U.S. Appl. No. 11/515,114, filed Aug. 31, 2005.

Forbes, L., et al., "Resonant Forward-Biased Guard-Ring Diodes for Suppression of Substrate Noise in Mixed-Mode CMOS Circuits", *Electronics Letters*, 31, (Apr. 1995), 720-721.

Forbes, Leonard, et al., "Silicon Lanthanide Oxynitride Films", U.S. Appl. No. 11/514, 533, filed Aug. 31, 2006.

Forbes, et al., "Tantalum Aluminum Oxynitride High-K Dielectric and Metal Gates", U.S. Appl. No. 11/514,655, filed Aug. 31, 2006.

Forbes, Leonard, et al., "Tantalum Silicon Oxynitride High-K Dielectrics and Metal Gates", U.S. Appl. No. 11/514,601, filed Aug. 31, 2006.

Forsgren, Katarina, "Atomic Layer Deposition of $HfO_2$ using hafnium iodide", Conference held in Monterey, California, (May 2001), 1 page.

Forsgren, Katarina, "CVD and ALD of Group IV- and V-Oxides for Dielectric Applications", *Comprehensive Summaries of Uppsala Dissertation from the Faculty of Science and Technology*, 665, (2001).

Foster, R., et al., "High Rate Low-Temperature Selective Tungsten", In: *Tungsten and Other Refractory Metals for VLSI Applications III*, V.A. Wells, ed., Materials Res. Soc., Pittsburgh, PA,(1988), 69-72.

Fuse, Tsuneaki, et al., "A 0.5V 200MHz 1-Stage 32b ALU Using a Body Bias Controlled SOI Pass-Gate Logic", *1997 IEEE International Solid-State Circuits Conference, Digest of Technical Papers*, (1997),286-287.

Fuyuki, Takashi, et al., "Electronic Properties of the Interface between Si and $TiO_2$ Deposited at Very Low Temperatures", *Japanese Journal of Applied Physics*, Part 1 (Regular Papers & Short Notes), 25(9), (September 1986),1288-1291.

Fuyuki, Takashi, et al., "Initial stage of ultra-thin $SiO_2$ formation at low temperatures using activated oxygen", *Applied Surface Science*, 117-118, (Jun. 1997),123-126.

Gagliano, F. P., et al., "Laser Processing Fundamentals", *In Lasers in Industry*, edited by S.S. Charschan, Van Nostrand Reinhold Company,(1972),156-164.

Gartner, M., et al., "Spectroellipsometric characterization of lanthanide-doped $TiO_2$ films obtained via the sol-gel technique", *Thin Solid Films*, 234(1-2), (1993),561-565.

Gartner, M, "Spectroellipsometric characterization of lanthanide-doped $TiO_2$ films obtained via the sol-gel technique", *Thin Solid Films*, 234(1-2), (1993),561-565.

Geller, S., et al., "Crystallographic Studies of Perovskite-like Compounds. II. Rare Earth Aluminates", *Acta Cryst.*, 9, (May 1956),1019-1025.

Giess, E. A., et al., "Lanthanide gallate perovskite-type substrates for epitaxial, high-$T_c$ superconducting $Ba_2YCu_3O_{7-\delta}$ films", *IBM Journal of Research and Development*, 34(6), (Nov. 1990),916-926.

Gong, S., "Techniques for reducing switching noise in high speed digital systems", *Proceedings Eighth Annual IEEE International ASIC Conference and Exhibit*, (1995),21-24.

Gosele, U., et al., "Self-propagating Room-temperature Silicon Wafer Bonding in Ultrahigh Vacuum", *Applied Physics Letters*, 67(24), (Dec. 11, 1995),3614-3616.

Guha, S, et al., "Atomic beam deposition of lanthanum-and yttrium-based oxide thin films for gate dielectrics", *Applied Physics Letters*, 77, (2000),2710-2712.

Guillaumot, B, et al., "75 nm damascene metal gate and high-k integration for advanced CMOS devices", *Technical Digest of International Electron Devices Meeting 2002*, (2002),355-358.

Guo, Xin, et al., "High quality ultra-thin (1.5 nm) $TiO_2$-$Si_3N_4$ gate dielectric for deep sub-micron CMOS technology", *IEDM Technical Digest. International Electron Devices Meeting*, (Dec. 5-8, 1999),137-140.

Gusev, E P., "Ultrathin High-K Dielectrics Grown by Atomic Layer Deposition: A Comparative Study of $ZrO_2$, $HfO_2$, $Y_2O_3$ and $Al_2O_3$", *Electrochemical Society Proceedings* vol. 2001-9, (2001),189-195.

Gutowski, M J., "Thermodynamic stability of high-K dielectric metal oxides $ZrO_2$ and $HfO_2$ in contact with Si and $SiO_2$", *Applied Physics Letters*, 80(11), (Mar. 18, 2002),1897-1899.

Hao, M. Y., "Electrical Characteristics of Oxynitrides Grown on Textured Single-Crystal Silicon", *Applied Physics Letters*, 60, (Jan. 1992),445-447.

Harada, M., "Suppression of Threshold Voltage Variation in MTCMOS/SIMOX Circuit Operating Below 0.5 V", *1996 Symposium on VLSI Technology, Digest of Technical Papers*, Honolulu, HI, (Jun. 11-13, 1996),96-97.

Harendt, Christine, "Silicon on Insulator Material by Wafer Bonding", *Journal of Electronic Materials*, 20(3), (Mar. 1991),267-77.

Hayashi, H., et al., "Fabrication of Low-temperature bottom-gate Poly-Si TFTs on large-area substrate by linear-beam excimer laser crystallization and ion doping method", *IEEE IEDM*, vol. 95, (1995),829-832.

Heavens, O., "Optical Properties of Thin Solid Films", *Optical Properties of Thin Solid Films*, Dover Pubs. Inc., New York,(1965),155-206.

Herrold, J., et al., "Growth and properties of microcrystalline germanium-carbide alloys", *Amorphous and Heterogeneous Silicon Thin films: Fundamentals to Devices—1999 Symposium*, San Francisco, CA, Apr. 5-9, 1999,(1999),16 pgs.

Herrold, J., et al., "Growth and properties of microcrystalline germanium-carbide alloys grown using electron cyclotron resonance plasma processing", *Journal of Non-Crystalline Solids* (Netherlands), 270(1-3), (May 2000),255-259.

Hirayama, Masaki, et al., "Low-Temperature Growth of High-Integrity Silicon Oxide Films by Oxygen Radical Generated in High Density Krypton Plasma", *International Electron Devices Meeting 1999. Technical Digest*, (1999),249-252.

Hisamoto, D., et al., "A New Stacked Cell Structure for Giga-Bit DRAMs using Vertical Ultra-Thin SOI (Delta) MOSFETs", *1991 IEEE International Electron Devices Meeting, Technical Digest*, Washington, D.C.,(Dec. 8-11, 1991),959-961.

Hodges, David A., et al., "MOS Decoders", In: *Analysis and Design of Digital Integrated Circuits*, 2nd Edition, Section: 9.1.3,(1988),354-357.

Holman, W. T., et al., "A Compact Low Noise Operational Amplifier for a 1.2 Micrometer Digital CMOS Technology", *IEEE Journal of Solid-State Circuits*, 30, (Jun. 1995),710-714.

Horiuchi, M, et al., "A mechanism of silicon wafer bonding", *of the First International Symposium on Semiconductor Wafer Bonding: Science, Technology and Applications*, (1992),48-62.

Hoshino, Y., et al., "Characterization and Control of the $HfO_2$/Si(001) Interfaces", *Applied Physics Letters*, 81, (Sep. 30, 2002),2650-2652.

Hoshino, Y., "Characterization and Control of the $HfO_2$/Si(001) Interfaces", *Applied Physics Letters*, 81, (Sep. 30, 2002),2650-2652.

Hu, G., "Will Flash Memory Replace Hard Disk Drive?", *1994 IEEE International Electron Device Meeting*, Panel Discussion, Session 24, Outline,(Dec. 1994),2 pages.

Huang, C. H., et al., "$La_2O_3$/$Si_{0.3}Ge_{0.7}$ p-MOSFETs with high hole mobility and good device characteristics", *IEEE Electron Device Letters*, 23 (12), (Dec. 2002),710-712.

Huang, W. L., et al., "TFSOI Complementary BiCMOS Technology for Low Power Applications", *IEEE Transactions on Electron Devices*, 42, (Mar. 1995),506-512.

Hubbard, K. J., et al., "Thermodynamic stability of binary oxides in contact with silicon", *Journal of Materials Research*, 11(11), (Nov. 1996),2757-2776.

Hunt, C. E., et al., "Direct bonding of micromachined silicon wafers for laser diode heat exchanger applications", *Journal of Micromechanics and Microengineering*, 1(3), (Sep. 1991),152-156.

Iddles, D M., et al., "Relationships between dopants, microstructure and the microwave dielectric properties of $ZrO_2$-$TiO_2$-$SnO_2$ ceramics", *Journal of Materials Science*, 27(23), (Dec. 1992),6303-6310.

Iijima, T., "Microstructure and Electrical Properties of Amorphous W-Si-N Barrier Layer for Cu Interconnections", *1996 VMIC Conference*, (1996),168-173.

Imthurn, George P., et al., "Bonded Silicon-on-Sapphire Wafers and Devices", *Journal of Applied Physics*, 72(6), (Sep. 1992),2526-7.

Iwai, H., et al., "Advanced gate dielectric materials for sub-100 nm CMOS", *International Electron Devices Meeting, 2002. IEDM '02, Digest.*, (Dec. 8-11, 2002),625-628.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001),471-474.

Jeon, Sanghun, et al., "Ultrathin nitrided-nanolaminate ($Al_2O_3$/$ZrO_2$/$Al_2O_3$) for metal-oxide-semiconductor gate dielectric applications", *Journal of Vacuum Science & Technology B: Microelectronics and Nanometer Structures*, 20(3), (May 2002),1143-5.

Jeong, Chang-Wook, et al., "Plasma-Assisted Atomic layer Growth of High-Quality Aluminum Oxide Thin Films", *Japanese Journal of Applied Physics*, 40, (Jan. 2001),285-289.

Jun, Y. K., "The Fabrication and Electrical Properties of Modulated Stacked Capacitor for Advanced DRAM Applications", *IEEE Electron Device Letters*, 13, (Aug. 1992),430-432.

Jung, T. S., "A 117-mm2 3.3-V Only 128-Mb Multilevel NAND Flash Memory for Mass Storage Applications", *IEEE Journal of Solid-State Circuits*, 31, (Nov. 1996), 1575-1583.

Jung, H S., et al., "Improved current performance of CMOSFETs with nitrogen incorporated $HfO_2$-$Al_2O_3$ laminate gate dielectric", *Technical Digest of International Electron Devices Meeting 2002*, (2002),853-856.

Kang, H. K., et al., "Highly Manufacturable Process Technology for Reliable 256 Mbit and 1 Gbit DRAMs", *IEEE International Electron Devices Meeting, Technical Digest*, San Francisco, CA,(Dec. 11-14, 1994),635-638.

Kang, L., et al., "MOSFET devices with polysilicon on single-layer HfO$_2$ high-K dielectrics", *International Electron Devices Meeting 2000. Technical Digest. IEDM*, (2000),35-8.

Kawai, Y., et al., "Ultra-low-temperature growth of high-integrity gate oxide films by low-energy Ion-assisted oxidation", *Applied Physics Letters*, 64(17), (Apr. 1994),2223-2225.

Keomany, D., et al., "Sol gel preparation of mixed cerium-titanium oxide thin films", *Solar Energy Materials and Solar Cells*, 33(4), (Aug. 1994),429-441.

Kim, Y W., et al., "50nm gate length logic technology with 9-layer Cu interconnects for 90nm node SoC applications", *Technical Digest of International Electron Devices Meeting 2002*, (2002),69-72.

Kim, Y. S., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA,(1996),675-680.

Kim, C. T., et al., "Application of Al$_2$O$_3$ Grown by Atomic Layer Deposition to DRAM and FeRam", *International Symposium in Integrated Ferroelectrics*, (Mar. 2000),316.

Kim, D., et al., "Atomic Control of Substrate Termination and Heteroepitaxial Growth of SrTiO$_3$/LaAlO$_3$ Films", *Journal of the Korean Physical Society*, 36(6), (Jun. 2000),444-448.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1-7.8.6.

Kim, Taeseok, et al., "Correlation between strain and dielectric properties in ZrTiO$_4$ thin films", *Applied Physics Letters*, 76(21), (May 2000),3043-3045.

Kim, Taeseok, et al., "Dielectric properties and strain analysis in paraelectric ZrTiO$_4$ thin films deposited by DC magnetron sputtering", *Japanese Journal of Applied Physics Part 1-Regular Papers Short Notes & Review Papers*, 39(7A), (2000),4153-4157.

Kim, Yongjo, et al., "Effect of microstructures on the microwave dielectric properties of ZrTiO$_4$ thin films", *Applied Physics Letters*, 78(16), (Apr. 16, 2001),2363-2365.

Kim, Y., et al., "Substrate dependence on the optical properties of Al$_2$O$_3$ films grown by atomic layer deposition", *Applied Physics Letters*, 71(25 ), (Dec. 22, 1997),3604-3606.

Kim, Y , "Substrate dependence on the optical properties of Al$_2$O$_3$ films grown by atomic layer deposition", *Applied Physics Letters*, vol. 71, No. 25, (Dec. 22, 1997),3604-3606.

Kishimoto, T., et al., "Well Structure by High-Energy Boron Implantation for Soft-Error Reduction in Dynamic Random Access Memories (DRAMs)", *Japanese Journal of Applied Physics*, 34, (Dec. 1995),6899-6902.

Kohyama, Y., et al., "Buried Bit-Line Cell for 64MB DRAMs", *1990 Symposium on VLSI Technology, Digest of Technical Papers*, Honolulu, HI, (Jun. 4-7, 1990),17-18.

Koshida, N., "Efficient Visible Photoluminescence from Porous Silicon", *Japanese Journal of Applied Physics*, 30, (Jul. 1991),L1221-L1223.

Kouvetakis, J., et al., "Novel chemical routes to silicon-germanium-carbon materials", *Applied Physics Letters*, 65(23), (Dec. 5, 1995),2960-2962.

Krauter, G., et al., "Room Temperature Silicon Wafer Bonding with Ultra-Thin Polymer Films", *Advanced Materials*, 9(5), (1997),417-420.

Kuge, Shigehiro, et al., "SOI-DRAM Circuit Technologies for Low Power High Speed Multigiga Scale Memories", *IEEE Journal of Solid-State Circuits*, 31(4), (Apr. 1996),pp. 586-591.

Kukli, Kaupo, "Atomic Layer Deposition of Titanium Oxide TiI$_4$ and H$_2$O$_2$", *Chemical Vapor Deposition*, 6(6), (2000),303-310.

Kukli, Kaupo, "Comparison of hafnium oxide films grown by atomic layer deposition from iodide and chloride precursors", *Thin Solid Films*, 416, (2002),72-79.

Kukli, K., et al., "Controlled growth of yttrium oxysulphide thin films by atomic layer deposition", *Materials Science Forum*, 315-317, (1999),216-221.

Kukli, Kaupo, "Dielectric Properties of Zirconium Oxide Grown by Atomic Layer Deposition from Iodide Precursor", *Journal of The Electrochemical Society*, 148(12), (2001),F227-F232.

Kukli, Kaupo, et al., "Influence of thickness and growth temperature on the properties of zirconium oxide films growth by atomic layer deposition on silicon", *Thin Solid Films*, 410(1-2), (2002),53-60.

Kukli, Kaupo, "Low-Temperature Deposition of Zirconium Oxide-Based Nanocrystalline Films by Alternate Supply of Zr[OC(CH$_3$)$_3$]$_4$ and H$_2$O", *Chemical Vapor Deposition*, 6(6), (2000),297-302.

Kukli, K J., et al., "Properties of hafnium oxide films grown by atomic layer deposition from hafnium tetraiodide and oxygen", *Journal of Applied Physics*, 92(10), (Nov. 15, 2002),5698-5703.

Kwo, J., et al., "High E gate dielectrics Gd$_2$O$_3$ and Y$_2$O$_3$ for silicon", *Applied Physics Letters*, 77(1), (Jul. 3, 2000),130-132.

Lantz, II, L., "Soft Errors Induced By Alpha Particles", *IEEE Transactions on Reliability*, 45, (Jun. 1996),174-179.

Lasky, J. B., "Wafer Bonding for Silicon-on-Insulator Technologies", *Applied Physics Letters*, 48(1), (Jan. 6, 1986),78-80.

Laursen, T., "Encapsulation of Copper by Nitridation of Cu-Ti Alloy/Bilayer Structures", *International Conference on Metallurgical Coatings and Thin Films*, Abstract No. H1.03, San Diego, CA,(Apr. 1997),309.

Lee, Byoung H., et al., "Characteristics of TaN gate MOSFET with ultrathin hafnium oxide (8 A-12 A)", *Electron Devices Meeting, 2000. IEDM Technical Digest. International*, (2000),39-42.

Lee, A E., et al., "Epitaxially grown sputtered LaAlO$_3$ films", *Applied Physics Letters*, 57(19), (Nov. 1990),2019-2021.

Lee, S. J., et al., "Hafnium oxide gate stack prepared by in situ rapid thermal chemical vapor deposition process for advanced gate dielectrics", *Journal of Applied Physics*, 92 (5), (Sep. 1, 2002),2807-09.

Lee, S J., "High quality ultra thin CVD HfO$_2$ gate stack with poly-Si gate electrode", *Electron Devices Meeting, 2000. IEDM Technical Digest. International*, (2000),31-34.

Lee, Cheng-Chung, et al., "Ion-assisted deposition of silver thin films", *Thin Solid Films*, 359,(2000),pp. 95-97.

Lee, Jung-Hyoung, et al., "Mass production worthy HfO$_2$-Al$_2$O$_3$ laminate capacitor technology using Hf liquid precursor for sub-100 nm DRAMs", *International Electron Devices Meeting, 2002. IEDM '02. Digest.*, (Dec. 8-11, 2002),221-224.

Lee, Dong H., et al., "Metalorganic chemical vapor deposition of TiO$_2$:N anatase thin film on Si substrate", *Appl. Phys. Lett.*, 66(7), (Feb. 1995),815-816.

Lee, L P., et al., "Monolithic 77 K dc Squid magnetometer", *Applied Physics Letters*, 59(23), (Dec. 1991),3051-3053.

Lee, C. H., "MOS Characteristics of Ultra Thin Rapid Thermal CVD ZrO$_2$ and Zr Silicate Gate Dielectrics", *Electron Devices Meeting, 2000. IEDM Technical Digest. International*, (2000),27-30.

Lee, C H., et al., "MOS Devices with High Quality Ultra Thin CVD ZrO$_2$ Gate Dielectrics and Self-Aligned TaN and TaN/Poly-Si Gate electrodes", *2001 Symposium on VLSI, Technology Digest of Technical Papers*, (2001),137-138.

Lee, B. H., et al., "Novel Pattern Transfer Process for Bonded SOI Giga-bit DRAMs", *IEEE International SOI Conference*, Piscataway, NJ,(1996),114-115.

Lee, Byoung H., et al., "Ultrathin Hafnium Oxide with Low Leakage and Excellent Reliability for Alternative Gate Dielectric Application", *Technical Digest of IEDM*, (1999),133-136.

Lehmann, V., "The Physics of Macropore Formation in Low Doped n-Type Silicon", *Journal of the Electrochemical Society*, 140(10), (Oct. 1993),2836-2843.

Leskela, M., "ALD precursor chemistry: Evolution and future challenges", *J. Phys. IV France*, 9, (1999),837-852.

Liu, C. T., "Circuit Requirement and Integration Challenges of Thin Gate Dielectrics for Ultra Small MOSFETs", *International Electron Devices Meeting 1998. Technical Digest*, (1998),747-750.

Liu, Y C., et al., "Growth of ultrathin SiO$_2$ on Si by surface irradiation with an O2+Ar electron cyclotron resonance microwave plasma at low temperatures", *Journal of Applied Physics*, 85(3), (Feb. 1999),1911-1915.

Lopez, E., et al., "Laser assisted integrated processing of SiGeC films on silicon", *Thin Solid Films*, vol. 453-454, (Apr. 1, 2004),46-51.

Lu, D, , "Bonding Silicon Wafers by Use of Electrostatic Fields Followed by Rapid Thermal Heating", *Materials Letters*, 4(11), (Oct. 1986),461-464.

Lu, N. , et al., "The SPT Cell—A New Substrate-Plate Trench Cell for DRAMs", *1985 IEEE International Electron Devices Meeting, Technical Digest*, Washington, D.C.,(Dec. 1-4, 1985),771-772.

Luan, et al., "High Quality $Ta_2O_5$ Gate Dielectrics and T [. . . ]", *IEEE Technical Digest of Int. Elec. Devices Mtng 1999*, (1999),141-142.

Lucovsky, G , et al., "Microscopic model for enhanced dielectric constants in low concentration $SiO_2$-rich noncrystalline Zr and Hf silicate alloys", *Applied Physics Letters*, 77(18), (Oct. 2000),2912-2914.

Luo, Z J., et al., "Ultra-thin $ZrO_2$ (or Silicate) with High Thermal Stability for CMOS Gate Applications", *2001 Symposium on VLSI Technology Digest of Technical Papers*, (2001),135-136.

MacSweeney, D. , et al., "Modelling of Lateral Bipolar Devices in a CMOS Process", *IEEE Bipolar Circuits and Technology Meeting*, Minneapolis, MN,(Sep. 1996),27-30.

Maeda, S. , et al., "A Vertical Phi-Shape Transistor (VPhiT) Cell for 1Gbit DRAM and Beyond", *1994 Symposium of VLSI Technology, Digest of Technical Papers*, Honolulu, HI,(Jun. 7-9, 1994),133-134.

Maeda, S. , et al., "Impact of a Vertical Phi-Shape Transistor (VPhiT) Cell for 1 Gbit DRAM and Beyond", *IEEE Transactions on Electron Devices*, 42, (Dec. 1995),2117-2123.

Malaviya, S. , "Dynamic Semiconductor RAM Structures", *IBM TBD*, 15, (Jul. 1972),p. 42.

Maria, J. P., et al., "High temperature stability in lanthanum and zirconia-based gate dielectrics", *Journal of Applied Physics*, 90(7), (Oct. 1, 2001),3476-3482.

Martin, P J., et al., "Ion-beam-assisted deposition of thin films", *Applied Optics*, 22(1), (Jan. 1983),178-184.

Masu, K. , et al., "Multilevel Metallization Based on Al CVD", *1996 IEEE Symposium on VLSI Technology, Digest of Technical Papers*, Honolulu, HI,(Jun. 11-13, 1996),44-45.

McCredie, B. D., et al., "Modeling, Measurement, and Simulation of Simultaneous Switching Noise", *IEEE Transactions on Components, Packaging, and Manufacturing Technology—Part B*, 19, (Aug. 1996),461-472.

Michaelson, Herbert B., "The work function of the elements and its periodicity", *Journal of Applied Physics*, 48(11), (Nov. 1977),4729-4733.

Molodyk, A A., et al., "Volatile Surfactant-Assisted MOCVD: Application to $LaAlO_3$ Thin Film Growth ", *Chemical Vapor Deposition*, 6(3), (Jun. 2000),133-138.

Molsa, Heini , et al., "Growth of yttrium oxide thin films from beta-diketonate precursor", *Advanced Materials for Optics and Electronics*, 4(6), (Nov.-Dec. 1994),389-400.

Muller, D. A., et al., "The Electronic Structure at the Atomic Scale of Ultrathin Gate Oxides", *Nature*, 399, (Jun. 1999),758-761.

Mumola, P. B., et al., "Recent Advances in Thinning of Bonded SOI Wafers by Plasma Assisted Chemical Etching", *Electrochemical Society Proceedings*, 95-7, (1995),28-32.

Nakagawara, Osamu , et al., "Electrical properties of (Zr, Sn)$TiO_4$ dielectric thin film prepared by pulsed laser deposition", *Journal of Applied Physics*, 80(1), (Jul. 1996),388-392.

Nakajima, Anri, "Atomic-layer deposition of $ZrO_2$ with a Si nitride barrier layer", *Applied Physics Letters*, 81(15), (Oct. 2002),2824-2826.

Nakajima, et al., "Atomic-layer-deposited silicon-nitride/$SiO_2$ stacked gate dielectrics for highly reliable p-metal-oxide-semiconductor filed-effect transistors", *Applied Physics Letters*, vol. 77, (Oct. 2000),2855-2857.

Nakajima, Anri , et al., "$NH_3$-annealed atomic-layer-deposited silicon nitride as a high-k gate dielectric with high reliability", *Applied Physics Letters*, 80(7), (Feb. 2002),1252-1254.

Nakajima, Anri, "Soft breakdown free atomic-layer-deposited silicon-nitride/$SiO_2$ stack gate dielectrics", *International Electron Devices Meeting. Technical Digest*, (2001),6.5.1-4.

Nakamura, et al., "Giga-bit DRAM Cells with Low Capacitance and Low Resistance Bit-Lines on Buried MOSFET's and Capacitors by Using Bonded SOI Technology—Reversed-Stacked-Capacitor (RSTC) Cell-", *Technical Digest—International Electron Devices Meeting*, (1995),889-892.

Neumayer, D A., et al., "Materials characterization of $ZrO_2$-$SiO_2$ and $HfO_2$-$SiO_2$ binary oxides deposited by chemical solution deposition", *Journal of Applied Physics*, 90(4), (Aug. 15, 2001),1801-1808.

Nieminen, Minna , et al., "Formation and stability of lanthanum oxide thin films deposited from B-diketonate precursor", *Applied Surface Science*, 174(2), (Apr. 16, 2001),155-165.

Niilisk, A , "Atomic-scale optical monitoring of the initial growth of $TiO_2$ thin films", *Proceedings of the SPIE—The International Society for Optical Engineering*, 4318, (2001),72-77.

Nitayama, A. , et al., "High Speed and Compact CMOS Circuits with Multipillar Surrounding Gate Transistors", *IEEE Transactions on Electron Devices*, 36, (Nov. 1989),2605-2606.

Oates, D E., et al., "Surface impedance measurements of $YBa_2Cu_3O_{7-x}$ thin films in stripline resonators", *IEEE Transactions on Magnetics*, vol. 27, No. 2, pt.2, (Mar. 1991),867-871.

Oh, C B., et al., "Manufacturable embedded CMOS 6T-SRAM technology with high-k gate dielectric device for system-on-chip applications", *Technical Digest of International Electron Devices Meeting 2002*, (2002),423-426.

Ohba, T. , et al., "Evaluation on Selective Deposition of CVD W Films by Measurement of Surface Temperature", In: *Tungsten and Other Refractory Metals for VLSI Applications II*, Materials Research Society, Pittsburgh, PA,(1987),59-66.

Ohba, T. , et al., "Selective Chemical Vapor Deposition of Tungsten Using Silane and Polysilane Reductions" , In: *Tungsten and Other Refractory Metals for VLSI Applications IV*, Materials Research Society, Pittsburgh, PA,(1989),17-25.

Ohmi, S. , et al., "Rare Earth Metal Oxides for High-K Gate Insulator", *Electrochemical Society Proceedings*, vol. 2002-2, (2002),376-387.

Ohno, Y. , et al., "Estimation of the Charge Collection for the Soft-Error Immunity by the 3D-Device Simulation and the Quantitative Investigation", *Simulation of Semiconductor Devices and Processes*, 6, (Sep. 1995),302-305.

Ohring, Milton , "The Materials Science of Thin Films", *Boston : Academic Press*, (1992),118,121,125.

Oowaki, Y. , et al., "New alpha-Particle Induced Soft Error Mechanism in a Three Dimensional Capacitor Cell", *IEICE Transactions on Electronics*, 78-C, (Jul. 1995),845-851.

Oshida, S. , et al., "Minority Carrier Collection in 256 M-bit DRAM Cell on Incidence of Alpha-Particle Analyzed by Three-Dimensional Device Simulation", *IEICE Transactions on Electronics*, 76-C, (Nov. 1993),1604-1610.

Osten, H J., et al., "High-k Gate Dielectrics with Ultra-low Leakage Current Based on Praseodymium Oxide", *Technical Digest of IEDM*, (2000),653-656.

Ozaki, T. , et al., "A Surrounding Isolation-Merged Plate Electrode (Simple) Cell with Checkered Layout for 256Mbit DRAMs and Beyond", *1991 IEEE International Electron Devices Meeting*, Washington, D.C.,(Dec. 8-11, 1991),469-472.

Pan, Tung M., et al., "High quality ultrathin $CoTiO_3$ high-k gate dielectrics", *Electrochemical and Solid-State Letters*, 3(9), (Sep. 2000),433-434.

Pan, Tung M., et al., "High-k cobalt-titanium oxide dielectrics formed by oxidation of sputtered Co/Ti or Ti/Co films", *Applied Physics Letters*, 78(10), (Mar. 5, 2001),1439-1441.

Park, Jaehoo , et al., "Chemical vapor deposition of $HfO_2$ thin films using a novel carbon-free precursor: characterization of the interface with the silicon substrate", *Journal of the Electrochemical Society*, 149(1), (2002),G89-G94.

Park, Byung-Eun , et al., "Electrical properties of $LaAlO_3$/Si and $Sr_{0.8}Bi_{2.2}Ta_2O_9/LaAlO_3$/Si structures", *Applied Physics Letters*, 79(6), (Aug. 2001),806-808.

Park, Byoung K., et al., "Interfacial reaction between chemically vapor-deposited $HfO_2$ thin films and a HF-cleaned Si substrate during film growth and postannealing", *Applied Physics Letters*, 80(13), (Apr. 1, 2002),2368-70.

Parke, S. A., et al., "A High-Performance Lateral Bipolar Transistor Fabricated on SIMOX", *IEEE Electron Device Letters*, 14, (Jan. 1993),33-35.

Pein, H. , "A 3-D Sidewall Flash EPROM Cell and Memory Array", *IEEE Transactions on Electron Devices*, 40, (Nov. 1993),2126-2127.

Pein, H., "Performance of the 3-D Pencil Flash EPROM Cell and Memory Array", *IEEE Transactions on Electron Devices*, 42, (Nov. 1995),1982-1991.

Pein, H. B., "Performance of the 3-D Sidewall Flash EPROM Cell", *IEEE International Electron Devices Meeting, Technical Digest*, (1993),11-14.

Perkins, Charles M., et al., "Electrical and materials properties of $ZrO_2$ gate dielectrics grown by atomic layer chemical vapor deposition", *Applied Physics Letters*, 78(16), (Apr. 2001),2357-2359.

Poveshchenko, V P., et al., "Investigation of the phase composition of films of zirconium, hafnium and yttrium oxides", *Soviet Journal of Optical Technology*, 51(5), (1984),277-279.

Qi, Wen-Jie, et al., "MOSCAP and MOSFET characteristics using $ZrO_2$ gate dielectric deposited directly on Si", *Electron Devices Meeting, 1999. IEDM Technical Digest. International*, (1999),145-148.

Qi, Wen-Jie, et al., "Performance of MOSFETs with ultra thin $ZrO_2$ and Zr silicate gate dielectrics", *2000 Symposium on VLSI Technology. Digest of Technical Papers*, (2000),40-41.

Rahtu, Antti, "Atomic Layer Deposition of Zirconium Titanium Oxide from Titanium Isopropoxide and Zirconium Chloride", *Chemistry of Materials*, 13(5), (May 2001),1528-1532.

Ramakrishnan, E S., et al., "Dielectric properties of radio frequency magnetron sputter deposited zirconium titanate-based thin films", *Journal of the Electrochemical Society*, 145(1), (Jan. 1998),358-362.

Ramm, J., et al., "Hydrogen cleaning of silicon wafers. Investigation of the wafer surface after plasma treatment", *Thin Solid Films*, 228, (1993),23-26.

Ramo, S., *Fields and Waves in Communication Electronics*, Third Edition, John Wiley & Sons, Inc,(1994),428-433.

Rao, K. V., et al., "Trench Capacitor Design Issues in VLSI DRAM Cells", *1986 IEEE International Electron Devices Meeting, Technical Digest*, Los Angeles, CA,(Dec. 7-10, 1986),140-143.

Rayner Jr., G, et al., "The structure of plasma-deposited and annealed pseudo-binary $ZrO_2$-$SiO_2$ alloys", *Materials Research Society Symposium—Proceedings*, 611, (2000),C131-C139.

Richardson, W. F., et al., "A Trench Transistor Cross-Point DRAM Cell", *IEEE International Electron Devices Meeting*, Washington, D.C.,(Dec. 1-4, 1985),714-717.

Ritala, M., "Atomic layer deposition of oxide thin films with metal alkoxides as oxygen sources", *Science*, 288(5464), (Apr. 14, 2000),319-321.

Ritala, Mikko, "Atomic Layer Epitaxy Growth of Titanium, Zirconium and Hafnium Dioxide Thin Films", *Annales Academiae Scientiarum Fennicae*, (1994),24-25.

Ritala, Mikko, "Zirconium dioxide thin films deposited by ALE using zirconium tetrachloride as precursor", *Applied Surface Science*, 75, (Jan. 1994),333-340.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1791.

Rossnagel, S. M., et al., "Plasma-enhanced atomic layer deposition of Ta and Ti for Interconnect diffusion barriers", *Journal of Vacuum Science & Technology B (Microelectronics and Nanometer Structures)*, 18(4), (Jul. 2000),2016-2020.

Rotondaro, A L., et al., "Advanced CMOS Transistors with a Novel HfSiON Gate Dielectric", *Symposium on VLSI Technology Digest of Technical Papers*, (2002),148-149.

Ryu, Changsup, "Barriers for Copper Interconnections", *Solid State Technology*, 42(4), (Apr. 1999),pp. 1-3.

Sagara, K., "A 0.72 micro-meter2 Recessed STC (RSTC) Technology for 256Mbit DRAMs using Quarter-Micron Phase-Shift Lithography", *1992 Symposium on VLSI Technology, Digest of Technical Papers*, Seattle, WA,(Jun. 2-4, 1992),10-11.

Saito, Yuji, et al., "Advantage of Radical Oxidation for Improving Reliability of Ultra-Thin Gate Oxide", *2000 Symposium on VLSI Technology Digest of Technical Papers*, (2000),176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999),152-153.

Seevinck, E., et al., "Current-Mode Techniques for High-Speed VLSI Circuits with Application to Current Sense Amplifier for CMOS SRAM's", *IEEE Journal of Solid State Circuits*, 26(4), (Apr. 1991),pp. 525-536.

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, (Sep. 1994),1765-1773.

Shah, A. H., et al., "A 4-Mbit DRAM with Trench-Transistor Cell", *IEEE Journal of Solid-State Circuits*, SC-21, (Oct. 1986),618-625.

Shah, A. H., et al., "A 4Mb DRAM with Cross-Point Trench Transistor Cell", *1986 IEEE International Solid-State Circuits Conference, Digest of Technical Papers*, (Feb. 21, 1986),268-269.

Shanware, A, et al., "Reliability evaluation of HfSiON gate dielectric film with 12.8 A $SiO_2$ equivalent thickness", *International Electron Devices Meeting. Technical Digest*, (2001),6.6.1-6.6.4.

Sherony, M. J., "Reduction of Threshold Voltage Sensitivity in SOI MOSFET's", *IEEE Electron Device Letters*, 16, (Mar. 1995),100-102.

Shimbo, M., et al., "Silicon-to-Silicon direct bonding method", *J. Appl. Phys.* vol. 60, No. 8, (Oct. 1986),2987-2989.

Shimizu, Takashi, et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A, (2003),L1315-L1317.

Shimomura, K., et al., "A 1V 46ns 16Mb SOI-DRAM with Body Control Technique", *1997 IEEE International Solid-State Circuits Conference, Digest of Technical Papers*, (Feb. 6, 1997),68-69.

Shin, Chang H., et al., "Fabrication and Characterization of MFISFET using $AI_2O_3$ Insulating Layer for Non-Volatile Memory", *12th International Symposium in Integrated Ferroelectrics*, (Mar. 2000),1-9.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000),105-114.

Sneh, Ofer, "Thin film atomic layer deposition equipment for semiconductor processing", *Thin Solid Films*, 402(1-2), (2002),248-261.

Song, Hyun-Jung, et al., "Atomic Layer Deposition of $Ta_2O_5$ Films Using Ta(OC2H5)5 and NH3", *Ultrathin $SiO_2$ and High-K Materials for ULSI Gate Dielectrics. Symposium*, (1999),469-471.

Souche, D, et al., "Visible and infrared ellipsometry study of ion assisted $SiO_2$ films", *Thin Solid Films*, 313-314, (1998),676-681.

Stanisic, B. R., et al., "Addressing Noise Decoupling in Mixed-Signal IC's: Power Distribution Design and Cell Customization", *IEEE Journal of Solid-State Circuits*, 30, (Mar. 1995),321-326.

Stathis, J. H., et al., "Reliability Projection for Ultra-Thin Oxides at Low Voltage", *Tech. Dig. International Electron Device Meeting*, (1998),167-9

Stellwag, T. B., "A Vertically-Integrated GaAs Bipolar DRAM Cell", *IEEE Transactions on Electron Devices*, 38, (Dec. 1991),2704-2705.

Su, D. K., et al., "Experimental Results and Modeling Techniques for Substrate Noise in Mixed-Signal Integrated Circuits", *IEEE Journal of Solid-State Circuits*, 28(4), (Apr. 1993),420-430.

Suma, Katsuhiro, et al., "An SOI-DRAM with Wide Operating Voltage Range by CMOS/SIMOX Technology", *IEEE Journal of Solid-State Circuits*, 29(11), (Nov. 1994),pp. 1323-1329.

Summonte, C., et al., "Wide band-gap silicon-carbon alloys deposited by very high frequency plasma enhanced chemical vapor deposition", *Journal of Applied Physics*, 96 (7), (Oct. 1, 2004),3987-3997.

Sunouchi, K., et al., "A Surrounding Gate Transistor (SGT) Cell for 64/256Mbit DRAMs", *1989 IEEE International Electron Devices Meeting, Technical Digest*, Washington, D.C.,(Dec. 3-6, 1989),23-26.

Sunouchi, K., et al., "Process Integration for 64M DRAM Using an Asymmetrical Stacked Trench Capacitor (AST) Cell", *1990 IEEE International Electron Devices Meeting*, San Francisco, CA,(Dec. 9-12, 1990),647-650.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Sze, S. M., In: *Physics of Semiconductor Devices, Second Edition*, John Wiley & Sons, New York,(1981),p. 42.

Sze, S M., "Physics of Semiconductor Devices", *New York : Wiley*, (1981),431.

Sze, S M., "Physics of Semiconductor Devices", *New York : Wiley*, (1981),473.

Takai, M. , et al., "Direct Measurement and Improvement of Local Soft Error Susceptibility in Dynamic Random Access Memories", *Nuclear Instruments & Methods in Physics Research, B-99*, (Nov. 7-10, 1994),562-565.

Takoto, H. , et al., "High Performance CMOS Surrounding Gate Transistor (SGT) for Ultra High Density LSIs", *IEEE International Electron Devices Meeting, Technical Digest*, (1988),222-225.

Takato, H. , et al., "Impact of Surrounding Gate Transistor (SGT) for Ultra-High Density LSI's", *IEEE Transactions on Electron Devices*, 38, (Mar. 1991),573-578.

Takemoto, J. H., et al., "Microstrip Resonators and Filters Using High-TC Superconducting Thin Films on LaAlO$_3$", *IEEE Transaction on Magnetics*, 27(2), (Mar. 1991),2549-2552.

Tanabe, N. , et al., "A Ferroelectric Capacitor Over Bit-Line (F-COB) Cell for High Density Nonvolatile Ferroelectric Memories", *1995 Symposium on VLSI Technology, Digest of Technical Papers*, Kyoto, Japan,(Jun. 6-8, 1995),123-124.

Tarre, A , et al., "Comparative study of low-temperature chloride atomic-layer chemical vapor deposition of TiO$_2$ and SnO$_2$", *Applied Surface Science*, 175-176, (May 2001),111-116.

Tavel, B , et al., "High performance 40 nm nMOSFETs with HfO$_2$ gate dielectric and polysilicon damascene gate", *Technical Digest of International Electron Devices Meetings 2002*, (2002),429-432.

Temmler, D. , "Multilayer Vertical Stacked Capacitors (MVSTC) for 64 Mbit and 256 Mbit DRAMs", *1991 Symposium on VLSI Technology, Digest of Technical Papers*, (May 28-30, 1991),13-14.

Terauchi, M. , "A Surrounding Gate Transistor (SGT) Gain Cell for Ultra High Density DRAMs", *1993 Symposium on VLSI Technology, Digest of Technical Papers*, Kyoto, Japan,(1993),21-22.

Tewg, J.Y. , "Electrical and Physical Characterization of Zirconium-Doped Tantalum Oxide Films", *Electrochemical Society Proceedings*, vol. 2002-28, (2002),75-81.

Tong, Q. Y., et al., "Hydrophobic Silicon Wafer Bonding", *Applied Physics Letter* 64(5), (Jan. 31, 1994),625-627.

Tsui, P. G., et al., "A Versatile Half-Micron Complementary BiCMOS Technology for Microprocessor-Based Smart Power Applications", *IEEE Transactions on Electron Devices*, 42, (Mar. 1995),564-570.

Tyczkowski, J. , et al., "Electronic band structure of insulating hydrogenated carbon-germanium films", *Journal of Applied Physics*, 86(8), (Oct. 15, 1999),4412-4418.

Van Dover, R. B., "Amorphous lanthanide-doped TiO$_x$ dielectric films", *Applied Physics Letters*, 74(20), (May 17, 1999),3041-3043.

Van Dover, Robert B., et al., "Deposition of Uniform Zr-Sn-Ti-O films by ON-Axis Reactive Sputtering", *IEEE Electron Device Letters*, 19(9), (Sep. 1998),329-331.

Van Dover, R. B., "Discovery of a useful thin-film dielectric using a composition-spread approach", *Nature*, 392, (Mar. 12, 1998),162-164.

Verdonckt-Vandebroek, S. , et al., "High-Gain Lateral Bipolar Action in a MOSFET Structure", *IEEE Transactions on Electron Devices 38*, (Nov. 1991),2487-2496.

Viirola, H , "Controlled growth of antimony-doped tin dioxide thin films by atomic layer epitaxy", *Thin Solid Films*, 251, (Nov. 1994),127-135.

Viirola, H , et al., "Controlled growth of tin dioxide thin films by atomic layer epitaxy", *Thin Solid Films*, 249(2), (Sep. 1994),144-149.

Visokay, M R., "Application of HfSiON as a gate dielectric material", *Applied Physics Letters*, 80(17), (Apr. 2002),3183-3185.

Vittal, A. , et al., "Clock Skew Optimization for Ground Bounce Control", *1996 IEEE/ACM International Conference on Computer-Aided Design, Digest of Technical Papers*, San Jose, CA,(Nov. 10-14, 1996),395-399.

Wang, N. , "Digital MOS Integrated Circuits", *Digital MOS Integrated Circuits*, Prentice Hall, Inc. , Englewood Cliffs, NJ,(1989),p. 328-333.

Wang, P. W., "Excellent Emission Characteristics of Tunneling Oxides Formed Using Ultrathin Silicon Films for Flash Memory Devices", *Japanese Journal of Applied Physics*, 35, (Jun. 1996),3369-3373.

Watanabe, H. , et al., "A New Cylindrical Capacitor Using Hemispherical Grained Si (HSG-Si) for 256Mb DRAMs", *IEEE International Electron Devices Meeting, Technical Digest*, San Francisco, CA,(Dec. 13-16, 1992),259-262.

Watanabe, S. , et al., "A Novel Circuit Technology with Surrounding Gate Transistors (SGT's) for Ultra High Density DRAM's", *IEEE Journal of Solid-State Circuits*, 30, (Sep. 1995),960-971.

Watanabe, H. , "A Novel Stacked Capacitor with Porous-Si Electrodes for High Density DRAMs", *1993 Symposium on VLSI Technology, Digest of Technical Papers*, Kyoto, Japan,(1993),17-18.

Watanabe, H. , "An Advanced Fabrication Technology of Hemispherical Grained (HSG) Poly-Si for High Capacitance Storage Electrodes", *Extended Abstracts of the 1991 International Conference on Solid State Devices and Materials*, Yokohama, Japan,(1991),478-480.

Watanabe, H. , "Device Application and Structure Observation for Hemispherical-Grained Si", *J. Appl. Phys.*, 71, (Apr. 1992),3538-3543.

Watanabe, H. , "Hemispherical Grained Silicon (HSG-Si) Formation on In-Situ Phosphorous Doped Amorphous-Si Using the Seeding Method", *Extended Abstracts of the 1992 International Conference on Solid State Devices and Materials*, Tsukuba, Japan,(1992),422-424.

Weldon, M. K., et al., "Physics and Chemistry of Silicon Wafer bonding Investigated by Infrared Absorption Spectroscopy", *Journal of Vacuum Sci. Technology, B* 14(4), c1996 American Vacuum Society,(Jul./Aug. 1996),3095-3106.

Wilk, G D., et al., "Hafnium and zirconium silicates for advanced gate dielectrics", *Journal of Applied Physics*, 87(1), (Jan. 2000),484-492.

Wilk, G. D., "High-K gate dielectrics: Current status and materials properties considerations", *Journal of Applied Physics*, 89(10), (May 2001),5243-5275.

Wolf, Stanley, et al., "Future Trends in Sputter Deposition Processes", In: *Silicon Processing of the VLSI Era*, vol. 1, Lattice Press,(1986),374-380.

Wolf, Stanley , et al., "Silicon Processing for the VLSI Era—vol. I: Process Technology", *Second Edition, Lattice Press*, Sunset Beach, California,(2000), 443.

Wolfram, G , et al., "Existence range, structural and dielectric properties of Zr$_x$Ti$_y$Sn$_z$O$_4$ ceramics (x+y=2)", *Materials Research Bulletin*, 16(11), (Nov. 1981),1455-63.

Yamada, T. , et al., "A New Cell Structure with a Spread Source/Drain (SSD) MOSFET and a Cylindrical Capacitor for 64-Mb DRAM's", *IEEE Transactions on Electron Devices*, 38, (Nov. 1991),2481-2486.

Yamada, Hirotoshi , et al., "MOCVD of High-Dielectric-Constant Lanthanum Oxide Thin Films", *Journal of The Electrochemical Society*, 150(8), (Aug. 2003),G429-G435.

Yamada, T. , et al., "Spread Source/Drain (SSD) MOSFET Using Selective Silicon Growth for 64Mbit DRAMs", *1989 IEEE International Electron Devices Meeting, Technical Digest*, Washington, D.C. ,(Dec. 3-6, 1989),35-38.

Yamaguchi, Takeshi , "Band Diagram and Carrier Conduction Mechanism in ZrO$_2$/Zr-silicate/Si MIS Structure Fabricated by Pulsed-laser-ablation Deposition", *Electron Devices Meeting, 2000. IEDM Technical Digest. International*, (2000),19-22.

Yamaguchi, Takeshi , et al., "Study on Zr-Silicate Interfacial Layer of ZrO$_2$-MIS Structure Fabricated by Pulsed Laser Ablation Deposition Method", *Solid State Devices and Materials*, (2000),228-229.

Yamamoto, K. , "Effect of Hf metal predeposition on the properties of sputtered HfO$_2$/Hf stacked gate dielectrics", *Applied Physics Letters*, 81, (Sep. 9, 2002),2053-2055.

Yeh, Ching-Fa , et al., "The advanced improvement of PN mesa junction diode prepared by silicon-wafer direct bonding", *1991 International Symposium on VLSI Technology, Systems, and Applications, 1991. Proceedings of Technical Papers*, (May 22-24, 1991),136-140.

Zhang, H., "Atomic Layer Deposition of High Dielectric Constant Nanolaminates", *Journal of The Electrochemical Society*, 148(4), (Apr. 2001),F63-F66.

Zhang, H, et al., "High permitivity thin film nanolaminates", *Journal of Applied Physics*, 87(4), (Feb. 2000),1921-1924.

Zhong, Huicai, et al., "Electrical Properties of Ru and $RuO_2$ Gate Electrodes for Si-PMOSFET with $ZrO_2$ and Zr-Silicate Dielectrics", *Journal of Electronic Materials*, 30(12), (Dec. 2001),1493-1498.

Zhu, W, et al., "$HfO_2$ and HfAlO for CMOS: Thermal Stability and Current Transport", *IEEE International Electron Device Meeting 2001*, (2001),463-466.

Zucker, O, et al., "Application of Oxygen Plasma Processing to Silicon Direct Bonding", *Sensors and Actuators A*, 36, (1993),227-231.

U.S. Appl. No. 10/137,058, filed May 2, 2002, Atomic Layer Deposition and Conversion.

U.S. Appl. No. 10/789,042, filed Feb. 27, 2004, LaAlO3 Films.

U.S. Appl. No. 11/215,451, filed Aug. 29, 2005, Systems and Apparatus for Atomic-Layer Deposition.

U.S. Appl. No. 10/909,959, filed Aug. 2, 2004, Zirconium-Doped Tantalum Oxide Films.

U.S. Appl. No. 10/931,533, filed Aug. 31, 2004, Method of Forming Apparatus Having Oxide Films Formed Using Atomic Layer Deposition.

U.S. Appl. No. 10/930,167, filed Aug. 31, 2004, Atomic Layer Deposited Lanthanum Aluminum Oxide Dielectric Layer.

U.S. Appl. No. 10/929,272, filed Aug. 30, 2004, Atomic Layer Deposition and Conversion.

U.S. Appl. No. 10/931,341, filed Aug. 31, 2004, Zr-Sn-Ti-O Films.

U.S. Appl. No. 10/930,431, filed Aug. 31, 2004, HfAlO3 Films for Gate Dielectrics.

U.S. Appl. No. 10/931,365, filed Aug. 31, 2004, Electronic Devices Having Lanthanide Dielectrics.

U.S. Appl. No. 10/931,845, filed Aug. 31, 2004, Methods, Systems, and Apparatus for Uniform Chemical-Vapor Depositions.

U.S. Appl. No. 10/931,595, filed Aug. 31, 2004, Methods, Systems, and Apparatus for Uniform Chemical-Vapor Depositions.

U.S. Appl. No. 11/029,757, filed Jan. 5, 2005, Methods for Fabricating Hafnium Tantalum Oxide Dielectrics.

U.S. Appl. No. 11/055,380, filed Feb. 10, 2005, Atomic Layer Deposition of CeO2/Al2O3 Films as Gate Dielectrics.

U.S. Appl. No. 11/053,577, filed Feb. 8, 2005, Atomic Layer Deposition of Dy-Doped HFO2 Films as Gate Dielectrics.

U.S. Appl. No. 11/031,289, filed Jan. 7, 2005, Lanthanide Doped TiOx Dielectric Films by Plasma Oxidation.

U.S. Appl. No. 11/093,104, filed Mar. 29, 2005, Atomic Layer Deposited Titanium Silicon Oxide Films.

U.S. Appl. No. 11/117,121, filed Apr. 28, 2005, Atomic Layer Deposited Zirconium Silicon Oxide Films.

U.S. Appl. No. 11/117,125, filed Apr. 28, 2005, Atomic Layer Deposition of a Ruthenium Layer to a Lanthanide Oxide Dielectric Layer.

U.S. Appl. No. 11/216,542, filed Aug. 30, 2005, Graded Dielectric Layers.

U.S. Appl. No. 11/197,184, filed Aug. 4, 2005, Method for Making Conductive Nanoparticle Charge Storage Element.

U.S. Appl. No. 11/084,968, filed Mar. 21, 2005, Zr-Sn-Ti-O Films.

U.S. Appl. No. 11/140,643, filed May 27, 2005, Hafnium Titanium Oxide Films.

U.S. Appl. No. 11/152,759, filed Jun. 14, 2005, Iridium / Zirconium Oxide Structure.

U.S. Appl. No. 11/178,914, filed Jul. 11, 2005, Nanolaminates of Hafnium Oxide and Zirconium Oxide.

U.S. Appl. No. 11/189,075, filed Jul. 25, 2005, Magnesium Titanium Oxide Films.

U.S. Appl. No. 11/216,958, filed Aug. 31, 2005, Cobalt Titanium Oxide Dielectric Films.

U.S. Appl. No. 11/216,474, filed Aug. 31, 2005, Lanthanum Aluminum Oxynitride Dielectric Films.

U.S. Appl. No. 11/215,578, filed Aug. 29, 2005, Zirconium-Doped Gadolinium Oxide Films.

U.S. Appl. No. 11/215,412, filed Aug. 29, 2005, Ruthenium Gate for a Lanthanide Oxide Dielectric Layer.

U.S. Appl. No. 11/213,013, filed Aug. 26, 2005, Electronic Apparatus With Deposited Dielectric Layers.

U.S. Appl. No. 11/459,792, filed Jul. 25, 2006, ZrAlxOy Dielectric Layers.

U.S. Appl. No. 11/212,306, filed Aug. 26, 2005, Atomic Layer Deposited Zirconium Titanium Oxide Films.

U.S. Appl. No. 11/214,693, filed Aug. 29, 2005, Atomic Layer Deposited Zr-Sn-Ti-O Films Using TiI4.

U.S. Appl. No. 11/297,567, filed Dec. 8, 2005, Lanthanide Yttrium Aluminum Oxide Dielectric Films.

U.S. Appl. No. 11/297,741, filed Dec. 8, 2005, Hafnium Tantalum Titanium Oxide Films.

U.S. Appl. No. 11/329,025, filed Jan. 10, 2006, Gallium Lanthanide Oxide Films.

U.S. Appl. No. 11/427,569, filed Jun. 29, 2006, Lanthanide Doped TiOX Dielectric Films.

U.S. Appl. No. 11/493,074, filed Jul. 26, 2006, Lanthanide Oxide / Hafnium Oxide Dielectric Layers.

U.S. Appl. No. 11/493,112, filed Jul. 26, 2006, Zirconium-Doped Tantalum Oxide Films.

U.S. Appl. No. 11/457,978, filed Jul. 17, 2006, Atomic Layer Deposited Nanolaminates of HfO2/ZrO2 Films as Gate Dielectrics.

U.S. Appl. No. 11/457,987, filed Jul. 17, 2006, Atomic Layer Deposited Nanolaminates of HfO2/ZrO2 Films as Gate Dielectrics.

U.S. Appl. No. 11/584,229, filed Oct. 20, 2006, Lanthanum Hafnium Oxide Dielectrics.

U.S. Appl. No. 11/528,776, filed Sep. 28, 2006, Atomic Layer Deposition of CeO2/Al2O3 Films as Gate Dielectrics.

U.S. Appl. No. 11/598,437, filed Nov. 13, 2006, Atomic Layer Deposited Zirconium Aluminum Oxide.

U.S. Appl. No. 11/566,038, filed Dec. 1, 2006, Lanthanum Aluminum Oxynitride Dielectric Films.

U.S. Appl. No. 11/608,281, filed Dec. 8, 2006, Zirconium-Doped Tantalum Oxide Films.

U.S. Appl. No. 11/565,826, filed Dec. 1, 2006, Hafnium Titanium Oxide Films.

U.S. Appl. No. 11/566,042, filed Dec. 1, 2006, Titanium Aluminum Oxide Films.

U.S. Appl. No. 11/608,286, filed Dec. 8, 2006, Lanthanum Aluminum Oxide Dielectric Layer.

U.S. Appl. No. 11/621,401, filed Jan. 9, 2007, Systems With a Gate Dielectric Having Multiple Lanthanide Oxide Layers.

U.S. Appl. No. 11/651,136, filed Jan. 9, 2007, Methods, Systems, and Apparatus for Uniform Chemical-Vapor Depositions.

U.S. Appl. No. 11/651,295, filed Jan. 9, 2007, Methods, Systems, and Apparatus for Uniform Chemical-Vapor Depositions.

U.S. Appl. No. 11/735,247, filed Apr. 13, 2007, Hafnium Tantalum Oxide Dielectrics.

U.S. Appl. No. 09/779,959, filed Feb. 9, 2001, External Matter.

U.S. Appl. No. 09/838,335, filed Apr. 20, 2001, External Matter.

U.S. Appl. No. 09/881,408, filed Jun. 13, 2001, External Matter.

U.S. Appl. No. 09/908,767, filed Jul. 18, 2001, External Matter.

US 6,827,790, 12/2004, Gealy et al. (withdrawn)

\* cited by examiner

METHODS FOR ATOMIC-LAYER DEPOSITION

This application is a continuation of U.S. application Ser. No. 10/137,168 filed May 2, 2002, now U.S. Pat. No. 7,160,577, which is incorporated herein by reference.

TECHNICAL FIELD

This invention concerns methods of making integrated circuits, particularly layer formation techniques, such as chemical-vapor deposition and atomic-layer deposition.

BACKGROUND OF INVENTION

Integrated circuits, the key components in thousands of electronic and computer products, are interconnected networks of electrical components fabricated on a common foundation, or substrate. Fabricators generally build these circuits layer by layer, using techniques, such as deposition, doping, masking, and etching, to form and interconnect thousands and even millions of microscopic transistors, resistors, and other electrical components on a silicon substrate, known as a wafer.

One common technique for forming layers in an integrated circuit is called chemical vapor deposition. Chemical vapor deposition generally entails placing a substrate in a reaction chamber, heating the substrate to prescribed temperatures, and introducing one or more gases, known as precursor gases, into the chamber to begin a deposition cycle. The precursor gases enter the chamber through a gas-distribution fixture, such as a gas ring or a showerhead, one or more centimeters above the substrate, and descend toward the heated substrate. The gases react with each other and/or the heated substrate, blanketing its surface with a layer of material. An exhaust system then pumps gaseous by-products or leftovers from the reaction out of the chamber through a separate outlet to complete the deposition cycle.

Conventional chemical-vapor-deposition (CVD) systems suffer from at least two problems. First, conventional CVD systems generally form non-uniformly thick layers that include microscopic hills and valleys, and thus generally require use of post-deposition planarization or other compensation techniques. Second, it is difficult, if not impossible, for CVD to provide uniform coverage of trench sidewalls or complete filling of holes and trenches.

To address these shortcomings, fabricators have developed atomic-layer deposition (ALD), a special form of CVD that allows highly uniform formation of ultra-thin layers having thicknesses of one molecule or several atoms of the deposited material. Though similar to CVD in terms of equipment and process flow, ALD relies on adsorption of some of the reactants into exposed surfaces, and thus provides coverage and fill of structural features that are difficult, if not impossible, using CVD.

In recent years, researchers and engineers have made strides toward making ALD commercially viable for some applications. For example, one team of researchers reportedly optimized an ALD process for depositing an aluminum oxide ($AlO_x$) film in thin-film heads—devices used to read and write magnetic data. See, Paranjpe et al., Atomic Layer Deposition of $AlO_x$ for Thin Film Head Gap Applications, Journal of Electrochemical Society, 148 (9), pp. G465-G471 (2001), which is incorporated herein by reference.

However, the present inventors have recognized that the equipment and processes reported as optimal for thin-film head applications suffer from some limitations relative to use in fabricating integrated circuits. For example, the reported process deposits material at the slow rate of less than one Angstrom per cycle, suggesting that more than 50 cycles would be necessary to form a 50-Angstrom-thick layer. Moreover, the reported equipment uses a larger than desirable reaction chamber, which takes longer to fill up or pump out, and thus prolongs the duration of each deposition cycle.

Accordingly, there is a need for better systems and methods of atomic-layer deposition of aluminum oxides as well as other material compositions.

DETAILED DESCRIPTION OF THE EXEMPLARY EMBODIMENTS

The following detailed description, which references and incorporates the above-identified figures, describes and illustrates one or more specific embodiments of the invention. These embodiments, offered not to limit but only to exemplify and teach the invention, are shown and described in sufficient detail to enable those skilled in the art to make and use the invention. Thus, where appropriate to avoid obscuring the invention, the description may omit certain information known to those of skill in the art.

One exemplary atomic-layer deposition system, well suited for aluminum-oxide depositions in integrated-circuit fabrication, includes an outer chamber, a substrate holder, and a unique gas-distribution fixture. The fixture includes a gas-distribution surface having two sets of holes and a gas-confinement member that forms a wall around the holes. In operation, one set of holes dispenses an aluminum-carrying precursor and the other dispensing an oxidizing agent gas, after the gas-confinement member engages, or otherwise cooperates with the substrate holder to form an inner chamber within the outer chamber.

The inner chamber has a smaller volume than the outer chamber and thus consumes less gas during the deposition process than would the outer chamber used alone. Also, the smaller chamber volume allows the exhaust system to pump the chamber more quickly, thus allowing shorter ALD cycles and potentially increasing rates of production.

Figure 1:
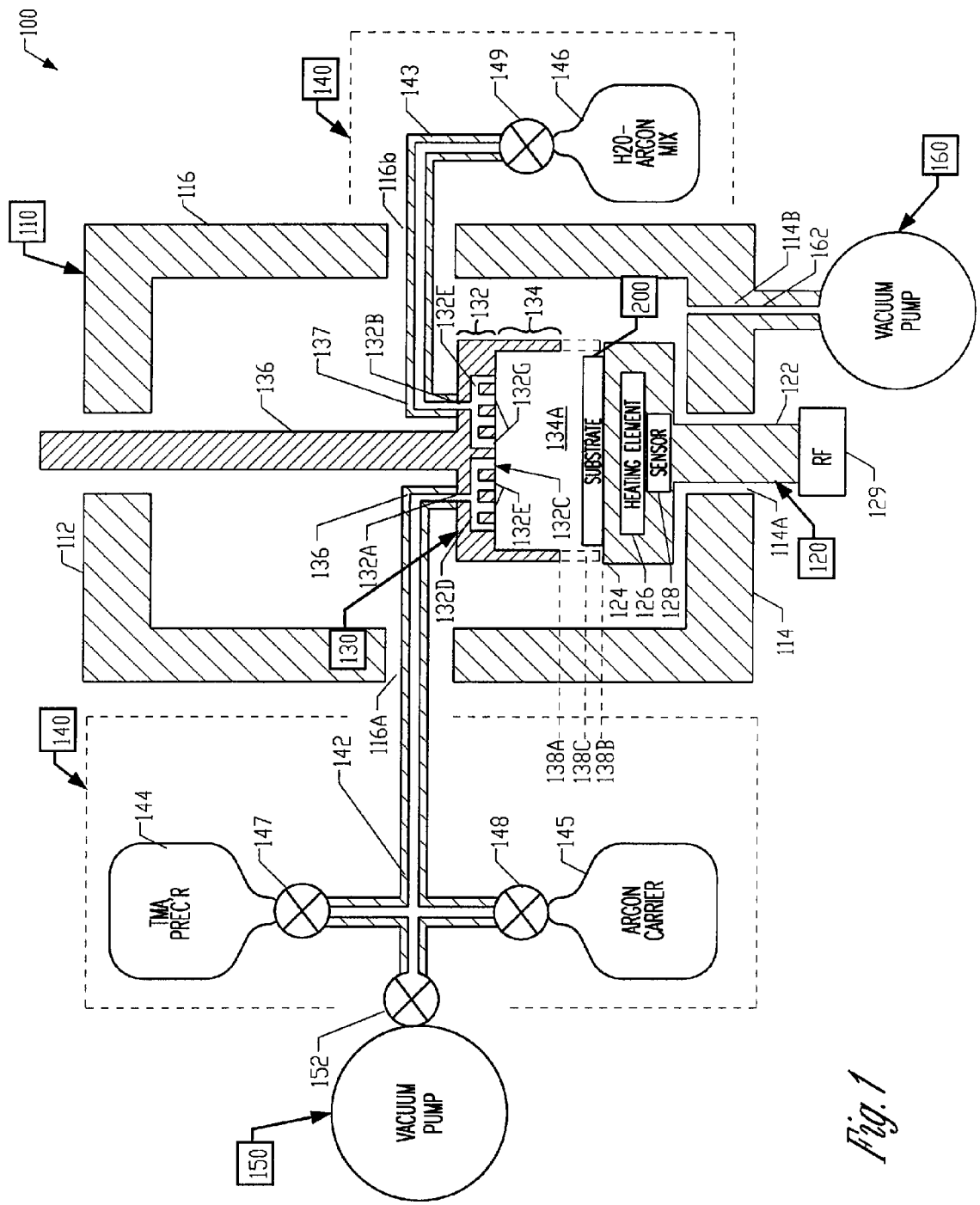
FIG. 1 is a side view of an exemplary deposition reactor according to the invention.

FIG. 1 shows an exemplary atomic-layer-deposition system 100 which incorporates teachings of the present invention. In particular, system 100 includes a chamber 110, a wafer holder 120, a gas-distribution fixture (or showerhead) 130, a gas-supply system 140, and exhaust pumps 150 and 160.

More particularly, chamber 110 includes respective top and bottom plates 112 and 114 and a sidewall 116. In the exemplary embodiment, chamber 110 is a cylindrical structure formed of stainless steel or glass. However, other embodiments use different structures and materials. Bottom plate 114 includes an opening 114A. Extending through opening 114A is a stem portion 122 of wafer holder 120.

Wafer holder 120 also includes a support platform 124, one or more heating elements 126, one or more temperature sensors 128, and an RF source 129. Holder 120 (also called a chuck) raises and rotates manually or automatically via lift and rotation devices, and is coupled to a power supply and temperature control circuitry (all of which are not shown). Support platform 124 supports one or more substrates, wafers, or integrated-circuit assemblies 200. Substrate 200 has an exemplary width or diameter of about 30 centimeters and an exemplary thickness in the range of 850-1000 microns. (The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.)

Heating elements 126 and temperature sensors 128 are used for heating substrates 200 to a desired temperature. Radio Frequency (RF) source 129, for example, a 1.25-kilo-watt-13.56-megahertz RF generator, is used to generate and sustain a capacitively coupled plasma between the wafer holder and gas-distribution fixture 130. (Some embodiments use generators with smaller or larger capacities.)

Fixture 130, positioned above wafer holder 120 and substrate 200, includes a gas-distribution member 132, a surface-projection (or gas-confinement) member 134, and gas inlets 136 and 137. In the exemplary embodiment, fixture 130 has three operating positions 138A, 138B, and 138C relative support platform 124. Fixture 130 takes operating position 138A, before and after depositions and operating position 138B during depositions. Position 138C is taken during a plasma anneal to ensure stability of the plasma.

Gas-distribution member 132 includes main gas inputs 132A and 132B, gas-distribution channels 132D and 132F, and gas-distribution holes 132E and 132G. Main gas inputs 132A and 132B feed respective gas-distribution channels 132D and 132F, which in turn feed respective gas-distribution holes 132E and 132G. (Holes 132E and 132G are actually interleaved in the exemplary embodiment, though shown simply in the figure as spatially segregated groups.) Holes 132D and 132F define a gas-distribution surface 132C.

In the exemplary embodiment, holes 132D and 132F are substantially circular with a common diameter in the range of 15-20 microns; gas-distribution channels 132D and 132F have a common width in the range of 20-45 microns; and surface 132C is substantially planar and parallel to platform 124 of wafer holder 120. However, other embodiments use other surface forms as well as shapes and sizes of holes and channels.

Extending from gas-distribution surface 132C is surface-projection member (or collar) 134. Member 134 projects or extends from surface 132C toward support platform 124, defining a fixture cavity 134A. The exemplary embodiment forms surface-projection member 134 from stainless steel as a uniform annular or circular wall or collar that projects perpendicularly from surface 132C to define a right-cylindrical cavity.

However, other embodiments form member 134 to project at other angles relative surface 132C. For example, some form the projection at an acute or obtuse angle, such as 45 or 135 degrees, and others form the projection to peripherally define an oval, ellipse, triangle, square, or any desirable regular or irregular polygon. Thus, the present invention encompasses a wide variety of projection shapes and configurations, indeed any projection shape that facilitates definition of an effective cavity or gas-confinement volume in cooperation with wafer holder 120 and/or substrate 200.

Figure 2:
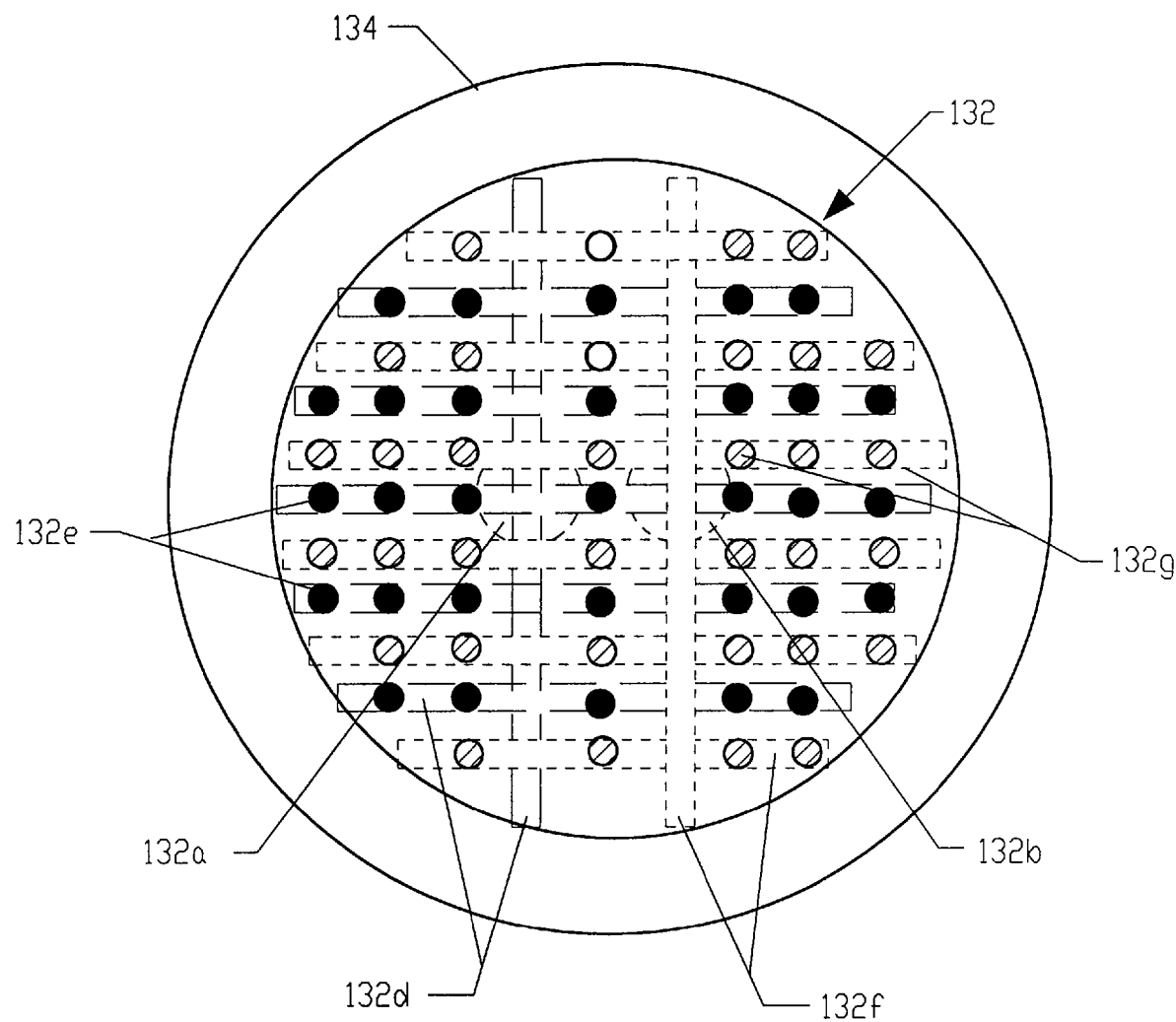
FIG. 2 is a plan view of an exemplary gas-distribution fixture according to the invention.

FIG. 2, a plan view, shows further details of the exemplary embodiment of gas-distribution fixture 130. In particular, the plan view shows not only exemplary circular peripheries of gas-distribution member 132 and surface-projection member 134, but also an exemplary interleaved distribution pattern for holes 132E and 132G, and an exemplary orthogonal arrangement of gas-distribution channels 132D and 132F. (Holes 132E are shown darkly shaded to distinguish them from holes 132G, which are cross-hatched.)

Other embodiments use other hole distribution patterns and channel arrangements. For example, some embodiments include random or concentric hole patterns and various channel geometries, including concentric circles, rectangles, or other regular or irregular concentric polygons. Some embodiments may also dedicate various subsets of channels and corresponding holes to different gases. For example, one embodiment provides one set of holes and channels for approximately uniform distribution of a gas or vapor, such as TMA precursor and argon carrier gas mixture, and another set of holes and channels for approximately uniform distribution of a gas or vapor, such as a water-argon mixture.

Gas-distribution member 132 can be made in a number of ways. One exemplary method entails laminating several material layers, with each layer including holes and/or channels to effect distribution of the gases to the separate holes. If the layers are made of silicon, the material layers can be patterned and etched, for example, using conventional photolithographic or micro-electro-mechanical systems (MEMS) technology, to form holes and channels. Dry-etching techniques produce small openings and channels, while wet etching produces larger openings and channels. For further details, see, for example, M. Engelhardt, "Modern Application of Plasma Etching and Patterning in Silicon Process Technology," Contrib. Plasma Physics, vol. 39, no. 5, pp. 473-478 (1999). Also see co-pending and co-assigned U.S. patent application Ser. No. 09/797,324, which was filed on Mar. 1, 2001, now U.S. Pat. No. 6,852,167, and which is incorporated herein by reference.

The processed layers can then be bonded together with the holes and channels in appropriate alignment using known wafer-bonding techniques. See, for example, G. Krauter et al., "Room Temperature Silicon Wafer Bonding with Ultra-Thin Polymer Films," Advanced Materials, vol. 9, no. 5, pp. 417-420 (1997); C. E. Hunt et al., "Direct Bonding of Micromachined Silicon Wafers for Laser Diode Heat Exchanger Applications," Journal of Micromechan. Microeng, vol. 1, pp. 152-156 (1991); Zucker, O. et al., "Applications of oxygen plasma processing to silicon direct bonding," Sensors and Actuators, A. Physical, vol. 36, no. 3, pp. 227-231 (1993), which are all incorporated herein by reference. See also, co-pending and co-assigned U.S. patent application Ser. No. 09/189,276 entitled "Low Temperature Silicon Wafer Bond Process with Bulk Material Bond Strength," which was filed Nov. 10, 1998, now U.S. Pat. No. 6,423,613, and which is also incorporated herein by reference. The resulting bonded structure is then passivated using thermal oxidation for example.

For an alternative fixture structure and manufacturing method that can be combined with those of the exemplary embodiment, see U.S. Pat. No. 5,595,606, entitled "Shower Head and Film Forming Apparatus Using Same, which is incorporated herein by reference. In particular, one embodiment based on this patent adds a projection or gas-confinement member to the reported showerhead structure.

FIG. 1 also shows that gas inlets 136 and 137, which feed respective holes 132E and 132G, are coupled to gas-supply system 140. Specifically, gas-supply system 140 includes gas lines 142 and 143, gas sources 144, 145, and 146, and manual or automated mass-flow controllers 147, 148, and 149. Gas line or conduit 142, which includes one or more flexible portions (not specifically shown), passes through an opening 116A in chamber sidewall 116 to connect with gas inlet 136. Gas sources 144 and 145 are coupled respectively via mass-flow controllers 147 and 148 to gas line 142. Gas line 143, which also includes one or more flexible portions (not specifically shown), passes through an opening 116B in chamber sidewall 116 is coupled via mass-flow controller 149 to source 146.

In the exemplary embodiment, which is tailored for aluminum oxide deposition, source 144 provides a vapor-drawn aluminum precursor, such as trimethylaluminum (TMA) with a vapor pressure of 11 Torr at room temperature; source 145 provides a carrier gas, such as argon; and source 146 provides an oxidant, such as a water-argon mixture. The water-argon mixture can be implemented by bubbling an argon carrier through a water reservoir. Other embodiments use other aluminum precursors, such as triisobutylaluminum (TIBA), dimethylaluminum hydride (DMAH), $AlC_3$, and other halogenated precursors and organometallic precursors. Other types of oxidants include $H_2O_2$, $O_2$, $O_3$, $N_2O$. Thus, the present invention is not limited to specific aluminum precursors or oxidants.

System 100 also includes vacuum pumps 150 and 160. Vacuum pump 150 is coupled to gas-distribution fixture 130 via a mass-flow controller 152 and gas line 142. And, vacuum pump 160 is coupled to the interior of chamber 110 via a line 162 and an opening 114B in chamber bottom plate 114.

In general operation, system 100 functions, via manual or automatic control, to move gas-distribution fixture 130 from operating position 138A to position 138B, to introduce reactant gases from sources 145, 146, and 147 through holes 132E and 132G in gas-distribution fixture 130 onto substrate 200, and to deposit desired matter, such as an aluminum oxide, onto a substrate.

Figure 3:
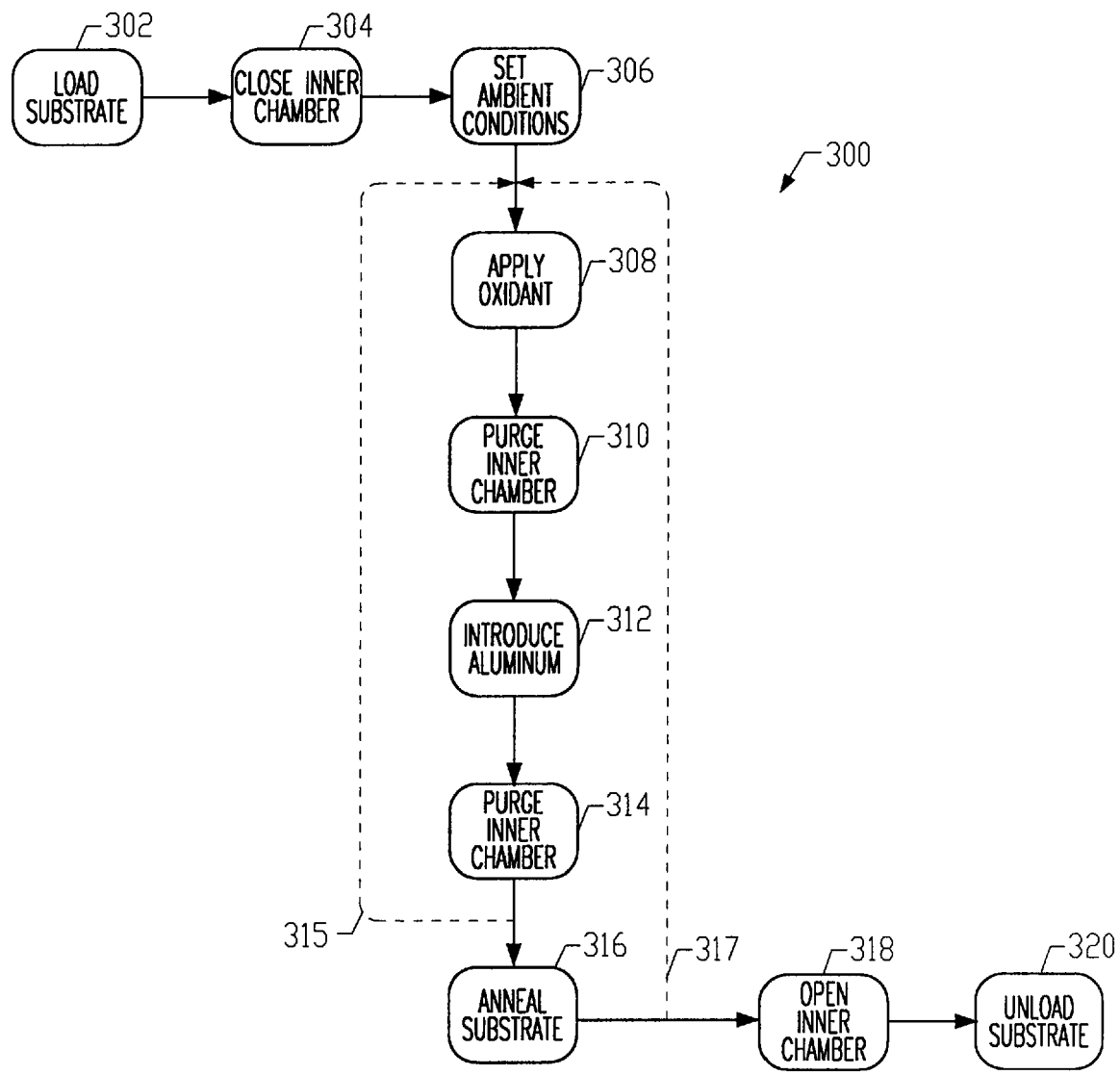
FIG. 3 is a flowchart showing an exemplary method according to the invention.

More particularly, FIG. 3 shows a flowchart 300 which illustrates an exemplary method of operating system 100. Flowchart 300 includes process blocks 302-320.

The exemplary method begins at block 302 with insertion of substrate 200 onto wafer holder 120. Execution then proceeds to block 304.

In block 304, the system forms or closes an inner chamber around substrate 200, or at least a portion of substrate 200 targeted for deposition. In the exemplary embodiment, this entails using a lever or other actuation mechanism (not shown) to move gas-distribution fixture 130 from position 138A to position 138B or to move wafer holder 120 from position 138B to 138A. In either case, this movement places gas-distribution surface 132C 10-20 millimeters from an upper most surface of substrate 200. In this exemplary position, a lower-most surface of surface-projection member 134 contacts the upper surface of support platform 124, with the inner chamber bounded by gas-distribution surface 132C, surface-projection member 134, and the upper surface of support platform 124.

Other embodiments define the inner chamber in other ways. For example, some embodiments include a surface-projection member on support platform 124 of wafer holder 120 to define a cavity analogous in structure and/or function to cavity 134A. In these embodiments, the surface-projection member takes the form of a vertical or slanted or curved wall, that extends from support platform 124 and completely around substrate 200, and the gas-distribution fixture omits a surface-projection member. However, some embodiments include one or more surface-projection members on the gas-distribution fixture and the on the support platform, with the projection members on the fixture mating, engaging, or otherwise cooperating with those on the support platform to define a substantially or effectively closed chamber. In other words, the inner chamber need not be completely closed, but only sufficiently closed to facilitate a desired deposition.

In block 306, after forming the inner chamber, the exemplary method continues by establishing desired ambient conditions for the desired deposition. This entails setting temperature and pressure conditions within chamber 110, including cavity 134A. To this end, the exemplary embodiment operates heating element 126 to heat substrate 200 to a desired temperature, such as 150-200° C., and operating vacuum pump 150 and/or pump 160 to establish a desired ambient pressure, such as 3.0 Torr. Gas-distribution fixture 130 is held at a temperature 30-50° C. warmer than its surroundings. (However, other embodiments can maintain the fixture at other relative operating temperatures.) After establishing the desired ambient conditions, execution continues at block 308.

Block 308 entails hydroxylating the surface of substrate 200 by introducing an oxidant into the separate chamber. To this end, the exemplary embodiment shuts mass-flow controllers 147 and 148 and operates mass-flow controller 149 to transfer an oxidant, such as a water in an argon carrier, from source 146 through gas line 143 and holes 132G into cavity 134A for a period, such as two seconds.

Notably, the inner chamber is smaller in volume than chamber 100 and thus requires less gas and less fill time to achieve desired chemical concentrations (assuming all other factors equal.) More precisely, the exemplary embodiment provides an inner chamber with an empty volume in the range of 70 to 350 cubic centimeters, based on a 1-to-5 millimeter inner-chamber height and a fixture with a 30-centimeter diameter. Additionally, the number and arrangement of holes in the fixture as well as the placement of the holes close to the substrate, for example within five millimeters of the substrate, promote normal gas incidence and uniform distribution of gases over the targeted portion of substrate 200.

Block 310 entails purging or evacuating the inner chamber to reduce water concentration in the gas-distribution fixture and inner chamber to trace levels. To this end, the exemplary method initially drives a high flow of argon gas from source 145 through fixture 130 into the inner chamber and then draws the gas out of the inner chamber through the fixture via vacuum pump 150, defining a purge cycle of less than five seconds, for example three-four seconds. The present invention, however, is not believed to be limited to any particular purge-cycle duration.

Next, as block 312 shows, the exemplary method introduces an aluminum precursor into the inner chamber through gas-distribution fixture 130. This entail operating mass-flow controllers 147 and 148 to respectively allow the flow of TMA and an argon carrier into fixture 130 via line 142 for a period of time such as 0.5-2.0 seconds. During this period, the argon carries the TMA to the hydroxylated surface of the substrate, causing formation of an approximately 0.8 Angstrom (Å) monolayer of aluminum oxide ($AlO_x$).

Block 314 entails purging or evacuating the inner chamber to reduce precursor concentration in the gas-distribution fixture and inner chamber to trace levels. To this end, the exemplary method initially drives a flow of argon gas from source 145 through fixture 130 into the inner chamber and then draws the gas out of the inner chamber through the fixture via vacuum pump 150. Again, this purge cycle is expected to consume less than five seconds.

At this point, as represented by a return path 315 back to block 304, blocks 304-314 can be repeated as many times as desired to achieve an aluminum-oxide layer within roughly one Angstrom of virtually any desired thickness from 5-10 Angstroms upwards. For semiconductor applications, such as forming gate dielectrics, thicknesses in the range of 50-80 Angstroms could be used.

Block 316 entails annealing the substrate and deposited aluminum-oxide layer to enhance the dielectric breakdown voltage of the layer. In the exemplary embodiment, this entails moving fixture 130 to operating position 138C (which establishes a substrate-to-fixture separation in the range of 30-50 millimeters) and using RF source 129 to generate a 250 Watt capacitively coupled plasma at 0.12 Torr in an argon-oxygen atmosphere (10 atom percent $O_2$) between the wafer holder. Some embodiments anneal after every monolayer to maximize dielectric breakdown strength, and some anneal after each 25-50 Angstroms of deposited material thickness. Though various anneal times are feasible, the exemplary embodiment anneals for 10-15 seconds in high-temperature environment. A return path 317 back to block 304 indicates that blocks 304-316 can be repeated as many times as desired.

In block 318, the system opens the separate chamber. In the exemplary embodiment, this entails automatically or manually moving gas-distribution fixture 130 to position 138A. Other embodiments, however, move the wafer holder or both the fixture and the wafer holder. Still other embodiments may use multipart collar or gas-confinement members which are moved laterally relative the wafer holder or gas-distribution fixture to open and close an inner chamber.

In block 320, substrate 200 is unloaded from chamber 110. Some embodiments remove the substrate manually, and others remove it using an automated wafer transport system.

CONCLUSION

In furtherance of the art, the inventors have presented new systems, methods, and apparatuses for atomic-layer deposition. One exemplary system includes an outer chamber, a substrate holder, and a unique gas-distribution fixture. The fixture engages, or otherwise cooperates with the substrate holder to form an inner chamber within the outer chamber. Notably, the inner chamber not only consumes less gas during deposition to reduce deposition waste and cost, but also facilitates rapid filling and purging to reduce deposition cycle times (with all other factors being equal.)

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

The invention claimed is:

1. A method comprising:
    forming a material on a substrate by atomic-layer deposition including:
        substantially enclosing the substrate in an inner chamber prior to exposing the substrate to precursors to form the material, the inner chamber formed within a chamber of an atomic-layer deposition system;
        exposing the substrate to the precursors by sending the precursors through a gas-distribution fixture of the atomic-layer deposition system into the inner chamber; and
        after exposing the substrate to one or more of the precursors, evacuating one or more gases from the inner chamber exiting through an opening in the gas-distribution fixture through which at least one of the precursors is sent into the inner chamber.

2. The method of claim 1, wherein the method includes holding the gas-distribution fixture to a temperature warmer than its surroundings.

3. The method of claim 1, wherein exposing the substrate to the precursors includes exposing the substrate to an oxidant precursor and one or more of a halogenated precursor or an organometallic precursor.

4. The method of claim 1, wherein forming a material on a substrate by atomic-layer deposition includes forming an oxide by the atomic-layer deposition.

5. The method of claim 4, wherein forming an oxide by the atomic-layer deposition includes forming aluminum oxide by the atomic-layer deposition.

6. A method comprising:
    forming a material as a gate dielectric on a substrate by atomic-layer deposition including:
        substantially enclosing the substrate in an inner chamber prior to exposing the substrate to precursors to form the material, the inner chamber formed within a chamber of an atomic-layer deposition system;
        exposing the substrate to the precursors by sending the precursors through a gas-distribution fixture of the atomic-layer deposition system into the inner chamber; and
        after exposing the substrate to one or more of the precursors, evacuating one or more gases from the inner chamber exiting through an opening in the gas-distribution fixture through which at least one of the precursors is sent into the inner chamber.

7. The method of claim 6, wherein substantially enclosing the substrate in an inner chamber includes moving a wafer holder that holds the substrate during processing towards the gas-distribution fixture.

8. The method of claim 6, wherein exposing the substrate to the precursors by sending the precursors through a gas-distribution fixture includes distributing different precursors through separate holes in the gas-distribution fixture.

9. The method of claim 6, wherein forming a material as a gate dielectric includes forming aluminum oxide by atomic layer deposition.

10. A method comprising:
    forming a material as a gate dielectric on a substrate by atomic-layer deposition including:
        substantially enclosing the substrate in an inner chamber prior to exposing the substrate to precursors to form the material, the inner chamber formed within a chamber of an atomic-layer deposition system;
        exposing the substrate to the precursors by sending the precursors through a gas-distribution fixture of the atomic-layer deposition system into the inner chamber; and
        after exposing the substrate to one or more of the precursors, evacuating one or more gases from the inner chamber exiting through an opening in the gas-distribution fixture through which at least one of the precursors is sent into the inner chamber, wherein substantially enclosing the substrate in an inner chamber includes moving the gas-distribution fixture towards the substrate.

11. A method comprising:
    forming an oxide on a substrate by atomic-layer deposition including:
        substantially enclosing the substrate in an inner chamber prior to exposing the substrate to precursors to form the oxide, the inner chamber formed within a chamber of an atomic-layer deposition system;
        hydroxylating a surface of the substrate by exposing the surface to at least one of the precursors by sending the at least one of the precursors through a gas-distribution fixture of the atomic-layer deposition system into the inner chamber;

exposing the hydroxylated surface to another of the precursors to form the oxide; and after exposing the surface to one or more of the precursors, evacuating one or more gases from the inner chamber exiting through an opening in the gas-distribution fixture to a gas supply line, the gas supply line configured to supply, to the inner chamber, a non-oxygen element to form the oxide containing the non-oxygen element.

12. The method of claim 10, wherein hydroxylating a surface of the substrate includes exposing the surface to an oxidant precursor.

13. The method of claim 11, wherein exposing the hydroxylated surface to another of the precursors includes exposing the hydroxylated surface to one or more of a halogenated precursor or an organometallic precursor.

14. The method of claim 11, wherein forming an oxide includes forming aluminum oxide.

15. The method of claim 11, wherein the method includes repeating hydroxylating a surface and exposing the hydroxylated surface substrate to form the oxide until the oxide has a specified thickness.

16. A method comprising:

forming a material on a substrate by atomic-layer deposition including:

substantially enclosing the substrate in an inner chamber prior to exposing the substrate to precursors to form the material, the inner chamber formed within a chamber of an atomic-layer deposition system;

exposing the substrate to the precursors by sending the precursors through a gas-distribution fixture of the atomic-layer deposition system into the inner chamber; and after exposing the substrate to one or more of the precursors, evacuating one or more gases from the inner chamber exiting through an opening in the gas-distribution fixture through which at least one of the precursors is sent into the inner chamber; and annealing the material formed on the substrate.

17. method of claim 16, wherein the method includes at least partially opening the inner chamber after forming the material on the substrate and before annealing the material on the substrate.

18. The method of claim 17, wherein annealing the material on the substrate includes applying a plasma anneal.

19. The method of claim 18, wherein forming the material includes forming aluminum oxide and applying a plasma anneal includes using a RF source.

20. The method of claim 16, wherein the method includes annealing in an argon-oxygen atmosphere.

21. A method comprising:

forming a dielectric material on a substrate by atomic-layer deposition including:

substantially enclosing the substrate in an inner chamber prior to exposing the substrate to precursors to form the dielectric material, the inner chamber formed within a chamber of an atomic-layer deposition system;

exposing the substrate to the precursors by sending the precursors through a gas-distribution fixture of the atomic-layer deposition system into the inner chamber; and after exposing the substrate to one or more of the precursors, evacuating one or more gases from the inner chamber exiting through an opening in the gas-distribution fixture through which at least one of the precursors is sent into the inner chamber; and annealing the dielectric material formed on the substrate.

22. The method of claim 21, wherein annealing the dielectric material on the substrate includes annealing after each 25-50 Angstroms of the dielectric material deposited prior to completely forming the layer of the dielectric material to a final thickness.

23. The method of claim 21, wherein annealing the dielectric material on the substrate includes annealing after every monolayer of the dielectric material formed by atomic-layer deposition.

24. The method of claim 21, wherein forming a dielectric material includes forming aluminum oxide.

25. The method of claim 21, wherein annealing the dielectric material on the substrate includes annealing after forming a layer of the dielectric material prior to completely forming the layer of the dielectric material to a final thickness.

* * * * *

UNITED STATES PATENT AND TRADEMARK OFFICE
CERTIFICATE OF CORRECTION

PATENT NO. : 7,670,646 B2 Page 1 of 1
APPLICATION NO. : 11/620324
DATED : March 2, 2010
INVENTOR(S) : Kie Y. Ahn et al.

It is certified that error appears in the above-identified patent and that said Letters Patent is hereby corrected as shown below:

In column 9, line 14, in Claim 12, delete "10," and insert -- 11, --, therefor.

In column 10, line 1, in Claim 17, delete "method" and insert -- The method --, therefor.

Signed and Sealed this

Twenty-fifth Day of May, 2010

David J. Kappos
*Director of the United States Patent and Trademark Office*